United States Patent
Kikuchi et al.

(10) Patent No.: US 7,268,611 B2
(45) Date of Patent: Sep. 11, 2007

(54) SEMICONDUCTOR DEVICE AND MEMORY CARD USING SAME

(75) Inventors: Mutsumi Kikuchi, Hitachi (JP); Noboru Akiyama, Hitachinaka (JP); Hiroyuki Shoji, Hitachi (JP); Fumio Murabayashi, Naka (JP); Akihiko Kanouda, Hitachinaka (JP); Takashi Sase, Hitachi (JP); Koji Tateno, Hitachi (JP)

(73) Assignee: Renesas Technology Corporation, Tokyo (JP)

( * ) Notice: Subject to any disclaimer, the term of this patent is extended or adjusted under 35 U.S.C. 154(b) by 69 days.

(21) Appl. No.: 10/524,087

(22) PCT Filed: Aug. 8, 2003

(86) PCT No.: PCT/JP03/10178

§ 371 (c)(1),
(2), (4) Date: Feb. 9, 2005

(87) PCT Pub. No.: WO2004/025730

PCT Pub. Date: Mar. 25, 2004

(65) Prior Publication Data

US 2005/0237039 A1 Oct. 27, 2005

(30) Foreign Application Priority Data

Aug. 9, 2002 (JP) .............................. 2002-233909
Sep. 20, 2002 (JP) .............................. 2002-274255

(51) Int. Cl.
*G05F 1/10* (2006.01)
(52) U.S. Cl. ...................... 327/536; 257/531
(58) Field of Classification Search ................ 327/536; 257/531
See application file for complete search history.

(56) References Cited

U.S. PATENT DOCUMENTS 5,420,558 A  5/1995 Ito et al. ..................... 336/200

(Continued)

FOREIGN PATENT DOCUMENTS

JP  60-136156  7/1985

(Continued)

OTHER PUBLICATIONS

Notification of Transmittal of Copies of Translation of the International Preliminary Examination Report; PCT International Preliminary Examination Report.

(Continued)

*Primary Examiner*—Kenneth B. Wells
(74) *Attorney, Agent, or Firm*—Crowell & Moring LLP

(57) ABSTRACT

A semiconductor device capable of achieving downsizing without reducing the power supply efficiency and capable of reducing switching noises and a memory card using the same are disclosed. The device comprises a plurality of stages of voltage booster circuits for potentially raising a power supply voltage up to a final output voltage, a voltage control unit for controlling an output voltage at a nearby location of the final stage, and one or more internal elements to which the final output voltage is supplied. A primary voltage booster circuit at the first stage includes an inductance element, a switching element, a diode and a driver circuit. At a metal core part of the inductance element, a metal wiring line is used, which was formed by use of a fabrication process of semiconductor integrated circuits, while employing for its core part an inter-wiring layer dielectric film that was formed using the fabrication process. In addition, the switching element and the diode are arranged so that portions thereof are disposed beneath the inductance element.

35 Claims, 17 Drawing Sheets

U.S. PATENT DOCUMENTS

| | | | |
|---|---|---|---|
| 5,469,399 A | 11/1995 | Sato et al. | 365/226 |
| 5,677,874 A | 10/1997 | Yamano | 365/226 |
| 6,469,573 B2 * | 10/2002 | Kanda et al. | 327/541 |
| 6,486,729 B2 * | 11/2002 | Imamiya | 327/536 |
| 6,525,362 B2 * | 2/2003 | Sadayuki | 257/298 |
| 6,605,986 B2 * | 8/2003 | Tanzawa et al. | 327/536 |
| 6,798,274 B2 * | 9/2004 | Tanimoto | 327/536 |
| 6,927,620 B2 * | 8/2005 | Senda | 327/536 |
| 6,977,828 B2 * | 12/2005 | Wada | 363/60 |

FOREIGN PATENT DOCUMENTS

| | | |
|---|---|---|
| JP | 60-257161 | 12/1985 |
| JP | 63-262273 | 10/1988 |
| JP | 07-021791 | 1/1995 |
| JP | 08-297986 | 11/1996 |
| JP | 09-051672 | 2/1997 |

OTHER PUBLICATIONS

Notification of Transmittal of Copies of Translation of the International Preliminary Examination Report; PCT International Preliminary Examination Report, May 6, 2005.

* cited by examiner

SEMICONDUCTOR DEVICE AND MEMORY CARD USING SAME

BACKGROUND OF THE INVENTION

The present invention relates to semiconductor devices having internal circuitry for producing either a voltage higher in potential than the power supply voltage or a lower voltage than an input voltage, which voltage is used to operate internal circuit elements. This invention also relates to electronic equipment such as memory cards using semiconductor devices of the type stated above.

As handheld or "mobile" information tools come into wide use, chances for hand-carrying data in the form of plug-in type semiconductor storage media increase, resulting in a likewise increase in amount of the carry-on data of high-quality images, audio and motion pictures as well as text documents. To this end, demands grow for non-volatile memories that are inevitable for conservation of these kinds of data—in particular, electrically erasable programmable read only memory (EEPROM) chips. An EEPROM with "all-at-once" erasability is called flash EEPROM (referred to as "flash memory" hereinafter), which is widely used as a large-capacity/low-cost nonvolatile memory as it performs an erase operation at a time on a per-block basis to thereby offer the capability to achieve higher integration densities.

While IC cards with a built-in flash memory are becoming popularized as cell phone-use cards, credit cards, cash cards and others, the quest for attaining multi-functionalities increases, which leads to a need for embedding a large-capacity memory capable of storing an operating system (OS) and application programs plus data while at the same time offering reliable functionality with lower power consumption. Due to this, there are advances in technologies for micro-fabrication of microcomputers and flash memories to be mounted in IC cards and also for lowering the supply voltage.

In addition, as consumer equipment grows in performance and functionality, flash memory-embedded microcomputers also are required to offer enhanced speed performances with lower power consumption, resulting in advances in downsizing and reduction of the power supply voltage of flash memory-embedded microcomputers or system-on-chip (SoC) devices.

In flash memories, a higher voltage than the supply voltage is necessary during data writing and erasing operations; for this reason, a voltage raising or "boosting" circuit is provided within a flash memory LSI. A circuit scheme, called the charge pump circuit, is widely used as such the booster circuit. An example of the charge pump circuit is shown in FIG. 29, wherein multiple stages of basic unit circuits each having a capacitor 160 and a diode 170 are serially connected together. A pulsate bias voltage is applied to one end of such capacitor, causing electrical charge to move toward the next step on a per-clock basis for potential riseup of the voltage of a capacitive load. Another example of the charge pump circuit is the so-called "voltage-doubling rectification" scheme, which charges up capacitors in parallel and then switches to a series connection to thereby obtain a high voltage required.

Further alternative voltage booster circuit schemes are available, which include a scheme for using a DC-DC converter circuit and a technique for using in combination a DC-DC converter circuit and a charge pump circuit, as disclosed in Japanese Application Patent Laid-open Publication Nos. Hei 07-21791 and Hei 08-297986, respectively.

Additionally, in voltage-drop circuit-embedded LSIs to be used when requiring a lower voltage than an input voltage, a dropper type circuit is employed; alternatively, when using a chopper type voltage drop circuit, inductors for use therein are discrete components, which are provided external to an LSI chip.

While the quest grows for miniaturization and lower power supply voltage of microcomputers or flash memories to be built in IC cards or flash memory-embedded microcomputers, voltages for use during write and erase operations of flash memories are hardly lowered due to the operation principles thereof even though microfabrication technologies are much advanced. For this reason, a difference between input and output voltages of the voltage booster circuitry tends to further increase in future.

With the charge pump scheme used for prior known voltage booster circuits, a potentially raised voltage per pump stage becomes a voltage with its potential equal to a difference between the power supply voltage and a diode drop-down voltage. Thus, as the supply voltage of an LSI decreases with advances in device miniaturization, the boosted voltage per pump stage becomes smaller. This results in the number of stages required for boosting up to a desired voltage increasing with a decrease in supply voltage, which leads to a likewise increase in layout area of circuits. As the memory capacity increases to provide large storage capacities of 1, 4 and 16 gigabits (Gb), such area increase becomes more noticeable. While the processors and memories will be lowered in voltage due to advances in microfabrication techniques, the flash memory's write and erase voltages are hardly changed. Thus, downsizing the power supply circuitry must be an important issue for LSIs of the type having built-in voltage booster circuits.

On the other hand, in known DC-DC converter schemes or DC-DC converter/charge-pump combining schemes, inductance element fabrication requires a "special" process not found in standard LSI processes—that is, a thick-film process aimed at magnetic core formation and achievement of lower resistance. Unfortunately the thick-film wiring is faced with a problem which follows: at circuit portions other than the inductance elements such as for example word lines of a memory, the wiring aspect becomes higher, resulting in the difficulty in microfabrication. This in turn makes it difficult to fabricate on-chip inductance elements. An approach to avoiding this risk is to the use of a method having the steps of forming inductance elements at separate processes and then bonding them together or alternatively an external connection method. For the reasons stated above, the known DC-DC converter schemes fail to be the voltage booster circuit scheme suitable for standard LSI processes.

Also note that voltage drop circuit-embedded LSIs also suffer from problems which follow: large power dissipation due to the dropper circuit designs, or a large parts-mount area due to the use of chopper circuits externally associated with external inductors.

It is therefore an object of the present invention to provide a semiconductor device capable of achieving size reduction of its associated power supply unit while using currently established semiconductor fabrication technologies and also capable of reducing switching noises. Another object of the invention is to provide a memory card using the semiconductor device.

SUMMARY OF THE INVENTION

In accordance with one aspect of this invention, there is provided a semiconductor device which causes an internal circuit to generate a higher voltage than the power supply voltage for operating internal circuit elements. The semiconductor device comprises a plurality of stages of voltage booster circuits for potentially raising the power supply voltage up to a predetermined final output voltage, an output voltage control means connected to a voltage booster circuit adjacent to a final stage of said voltage booster circuits, and an internal element to which an output of the voltage booster circuits is supplied, wherein a first stage voltage booster circuit of the voltage booster circuits for raising the power supply voltage up to a primary voltage is constituted from a converter circuit including an inductance element, a switching element and a diode, wherein voltage booster circuits in back of the first stage for raising the primary voltage up to the predetermined final voltage are each configured from a charge pump circuit including a capacitance element and a diode or a converter circuit including an inductance element, a switching element and a diode, wherein the inductance element and the switching element plus the diode making up the voltage booster circuit as well as the output voltage control means and the internal element are formed on a semiconductor substrate, and wherein the output voltage control means controls the voltage booster circuit near the final stage in such a way that the final output of the booster circuits becomes a potentially stabilized predetermined output voltage and then supplies such the output to the above-noted internal element.

The invention also provides a semiconductor device which is arranged to drive the gate of a switching element by a higher voltage than an input power supply voltage.

The invention also provides a semiconductor device in which a gate driver circuit for driving the gate of a switching element has a voltage booster circuit, wherein a higher voltage than the input supply voltage is used to drive the gate of the switching element.

The invention also provides a semiconductor device which is arranged to control the voltage booster circuit at the final stage in such a manner that the final output of the group of booster circuits becomes a potentially stabilized prespecified output voltage.

The invention also provides a semiconductor device which controls a voltage booster circuit immediately before the final-stage booster circuit so that the final output of the booster circuit group becomes a potentially stabilized pre-specified output voltage.

The invention provides a semiconductor device which ensures that at least one of converter circuits is designed so that either a potential boost ratio or a switching duty ratio is kept at a preset value during a boosting operation.

The invention also provides a semiconductor device which ensures that at least one of converter circuits is such that either its boost ratio or switching duty ratio is kept at a preset value during a boosting operation, and which has a means for setting the boost ratio or the switching duty ratio at a given value.

The invention also provides a semiconductor device having converter circuits, at least one of which is more than or equal to 10 MHz in switching frequency thereof.

The invention also provides a semiconductor device having an inductance element which is a parallel-connection type inductance element made up of multilayered metal wiring lines and a dielectric film provided between such wiring layers, wherein the multilayer metal wires are connected in parallel.

In accordance with another aspect of the invention, a semiconductor device having an internal circuit which generates a higher voltage than the power supply voltage for operating an internal element(s) and a memory card using the same are provided. The device comprises a plurality of stages of potential booster circuits for boosting the power supply voltage up to a predetermined final output voltage, a voltage control unit for control of an output voltage near the final stage, and an internal circuit element to which the final output voltage is supplied, wherein the plural stages of booster circuits include a converter circuit which at least has an inductance element, a switching element, a diode and a driver circuit for driving the switching element, and wherein the inductance element within the converter circuit at least includes a metal wiring line that is formed in the same process of metal wires for use as power supply wires.

The invention is also directed to a semiconductor device having an internal circuit that generates a higher voltage than the power supply voltage for operating an internal element(s) and a memory card using the same. The device comprises a plurality of stages of potential booster circuits for boosting the power supply voltage up to a predetermined final output voltage, a voltage control unit for control of an output voltage at or near the final stage, and an internal circuit element to which the final output voltage is supplied, wherein a primary booster circuit at the first stage comprises a converter circuit which at least has an inductance element, a switching element, a diode and a driver circuit for driving the switching element, and wherein the switching element and the diode are partially disposed to underlie the inductance element.

Alternatively, the switching element and the diode which are partly disposed beneath the inductance element are such that a drain-side region of the switching element and an anode-side region of the diode are laid out to oppose each other on a semiconductor substrate, wherein more than two sets of combination units, each having a combination of switching element and diode with the both regions being electrically connected together, are connected in parallel.

Alternatively the device may comprise a potential step-down circuit for reducing an input voltage to a prespecified final output voltage, which circuit consists essentially of an inductance element, a switching element, a diode, a driver circuit and a control circuit, wherein the switching element and the diode are partially disposed to underlie the inductance element.

An alternative configuration is that the switching element and the diode which are disposed beneath the inductance element are such that a source region of the switching element and a cathode-side region of the diode are laid out to oppose each other on a semiconductor substrate, wherein at least more than two sets of combination units, each having a combination of switching element and diode with the both regions being electrically coupled together, are connected in parallel. Additionally, the booster circuit is designed to have a spirally wired first metal wire for forming the inductance element, a second metal wire connected to an outer periphery end of the first metal wire for supplying the power supply voltage, an interlayer connection wire connected to an inner periphery end of the first metal wire while being wired from the inner periphery end toward underlying diffusion layers of the switching element and the diode, and a third metal wire for connection between the diffusion layers of the switching element and the diode.

Alternatively, the potential step-down circuit is configurable to comprise a spirally-wired first metal wiring line for forming the inductance element, an interlayer connection wire connected to an inner periphery end of the first metal wire while being wired from the inner periphery end toward underlying diffusion layers of the switching element and the diode, a third metal wire for connection between the diffusion layers, and a fourth metal wire connected to an outer periphery end of the first metal wire for outputting the final output voltage thus potentially reduced.

Alternatively the inductance element is arranged to have a first metal wire and an interconnect dielectric film between wiring layers.

In accordance with another further aspect of the invention, a device structure is provided which comprises a plurality of semiconductor devices each of which is similar to the above-noted semiconductor device, wherein these semiconductor devices are laid out to overlap each other, wherein those inductance elements within neighboring semiconductor devices are arranged so that the inductance elements within the other semiconductor devices are prevented from overlapping each other in the directions immediately above and below the inductance elements.

Alternatively, a multi-chip type semiconductor device is provided, wherein a plurality of semiconductor devices are formed on a semiconductor chip, wherein inductance elements of certain semiconductor devices are formed at part of the one half side of the semiconductor chip whereas those inductance elements of the other semiconductor devices neighboring upon the semiconductor devices is formed at part of the remaining half side of the chip.

Alternatively, the above-noted semiconductor device is either a nonvolatile memory or a nonvolatile memory-embedded microcomputer, which may be configured in the form of a flash memory or a flash memory-embedded microcomputer.

Alternatively, a memory card having the semiconductor device and a CPU is also provided.

DESCRIPTION OF THE INVENTION

Figure 1:
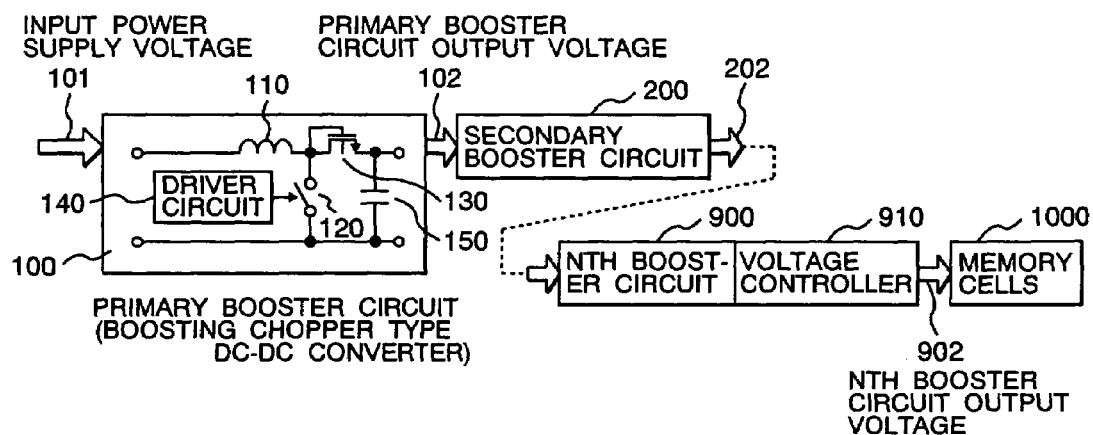
FIG. 1 is a diagram showing a voltage booster circuit of a semiconductor device in accordance with one embodiment of the present invention.

FIG. 1 is a diagram showing a configuration of voltage booster circuitry of a flash memory which uses an on-chip converter embodying the invention.

While the voltage booster circuit in the flash memory generates a plurality of output voltages to be supplied to an array of memory cells, a part thereof will be explained in this embodiment. A primary booster circuit 100 receives a power supply voltage 101 as input to the flash memory. The primary booster circuit 100 has its output to which a secondary booster circuit 200 is connected, for making up a series connection together with those leading up to an Nth booster circuit. In other words, a serial combination of multiple stages of booster circuits is provided to thereby constitute a plurality of stages of booster circuits. The Nth booster circuit 900 at the final stage has a voltage control means 910 which controls an output voltage 902 to be output from the final stage, and which is connected to a memory cell array 1000 that is an internal element. The primary booster circuit 100 at the first stage is a DC-DC converter circuit, which is generally made up of an inductance element 110, a switching element 120, a diode 130, a driver circuit 140 for driving the gate of such switching element, and an output smoothing capacitor 150. The individual one of the secondary booster circuit 200 to Nth booster circuit 900 is configured from a voltage-increasable DC-DC converter circuit or a charge pump circuit.

Upon receipt of a request for writing or reading data into or from the memory or for erasing it, a voltage-boosting power supply circuit within the flash memory starts a voltage boosting operation for supplying a predetermined voltage to the memory.

Figure 2:
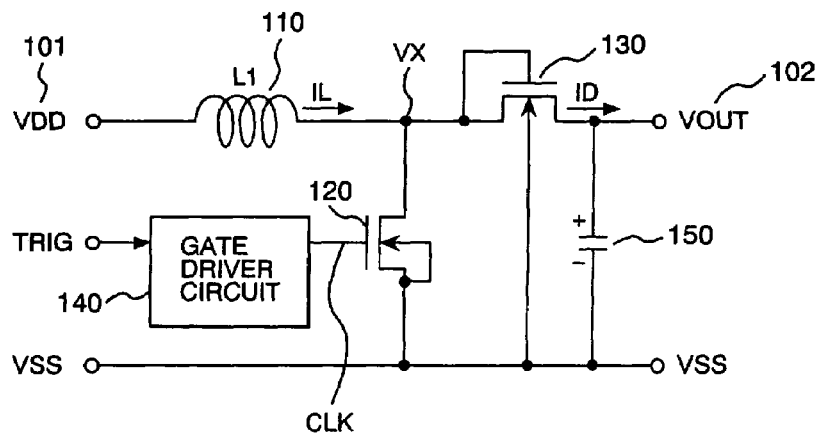
FIG. 2 is a diagram showing a configuration of a primary booster circuit of the semiconductor device in accordance with this invention.
Figure 3:
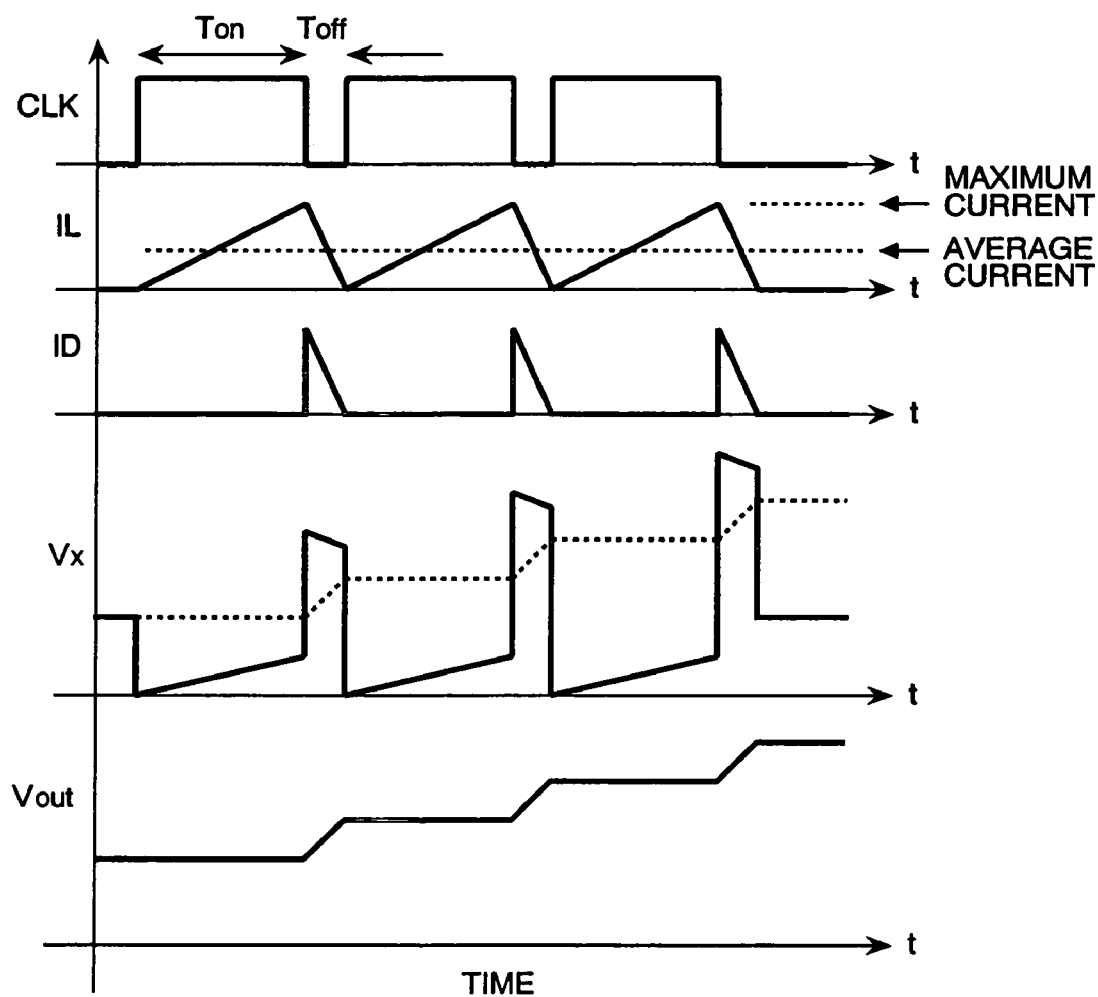
FIG. 3 is a diagram showing for explanation of an operation example of the primary booster circuit of the semiconductor device in accordance with the invention.

A basic circuit diagram of the voltage-increasable DC-DC converter circuit is shown in FIG. 2. FIG. 3 is a waveform diagram of its voltage boosting operation.

Firstly, in response to potential rise-up of an output signal CLK of the driver circuit 140, the switching element 120 of the primary booster circuit turns on, causing a current (IL) to flow into the inductance element 110. This results in a magnetic energy being stored therein. Next, when the switching element 120 turns off in responding to potential fall-down of CLK (High voltage to Low voltage), a diode current (ID) flows through the diode 130 due to the accumulated magnetic energy in such a way that a current of inductance element flows continuously, thereby charging up the output smoothing capacitor 150.

Note here that the diode 130 as used herein is a MOS diode made up of a MOS transistor with its drain and gate coupled together: in this description, a drain-side region coupled to the gate will be referred to as anode, whereas a source-side region is called cathode. Optionally, a Schottky diode or PN-junction diode or the like other than the MOS diode may be used as the diode 130 while taking into consideration the ON-to-OFF recovery characteristics.

The above-noted switching operation will be repeated, causing the input power supply voltage to rise in potential. Its behavior is shown in FIG. 3, in regard to an output voltage Vx of inductance element 110 and an output voltage Vout of primary booster circuit 100. A potentially raised or "boosted" output voltage Vout becomes an input of the secondary booster circuit. At this time, the output voltage Vout is given as Vin×(Ton+Toff)/Toff, where Ton is the ON time of switching element and Toff is its OFF time, under an assumption that magnetic fluxes stored during the time period Ton are drawn out during the period Toff. In other words, the voltage boost ratio is determined by a switching duty ratio.

In this embodiment, the switching duty ratio is kept constant and is then regarded as the voltage boosting ratio, whereby it becomes possible to reduce the circuit scale of the driver circuit 140.

Additionally, the driver circuit 140 that drives the gate of the switching element 120 includes a gate voltage booster circuit although not specifically depicted herein. By driving the gate of switching element 120 by a voltage higher than the input power supply voltage 101, it becomes possible to shrink the gate width of switching element. Thus it becomes possible to reduce the layout area of such switching element while enabling the switching element to decrease in gate capacitance and drain junction capacitance, which in turn makes it possible to suppress chargeup losses occurring due to these capacitances. Thus, the voltage booster circuit 100 is improved in efficiency as a whole. Furthermore, it is also possible to reduce the area required for the layout of switching elements, so it is possible to shorten the internal wiring length thereof. This makes it possible to suppress losses occurring due to wiring resistances. Although the gate voltage booster circuit in the driver circuit 140 uses a charge pump circuit, what is required for the driver circuit is that its output voltage is higher than the input power supply voltage 101. Owing to this, it becomes possible to permit the boost ratio of the gate voltage booster circuit to be lower than the boost ratio of the entirety. Also note that the load capacitance of the gate voltage booster circuit is the switching element gate capacitance only, which is less than the load of the voltage booster circuit 100. In view of the foregoing, the circuit scale of gate voltage booster circuit is more shrinkable when compared to the case where every booster circuit is realized by a charge pump circuit. Thus it is possible to provide a reduced area which allows it to be situated under the inductance element 110.

In this embodiment, those behind the primary voltage booster circuit are also designed so that each booster circuit boosts a voltage with its unique boost ratio in the case of using a DC-DC converter circuit. Appropriate control is done to provide a prespecified voltage at the final stage of Nth booster circuit, which voltage is then supplied to a memory cell or cells. In the case of using charge pump circuits for those behind the primary voltage booster circuit also, a similar design is employed to allow each booster circuit to boost a voltage with its fixed boost ratio, when the need arises. Then, control is done to provide a prespecified voltage at the final stage of Nth booster circuit, which is then supplied to a memory cell(s).

Optionally, the voltage control is also available by a procedure having the steps of controlling to provide a specified voltage at an (N−1)th voltage booster circuit immediately preceding the final stage, causing the final-stage Nth booster circuit to perform a boosting operation with its unique boost ratio, and then supplying the resultant voltage to a memory cell(s). With this approach, it becomes possible to reduce the circuit scale of the driver circuit 140. Alternatively, the voltage control is modifiable to be performed by both the final-stage Nth booster circuit and the (N−1)th booster circuit in order to attain conflicting requirements—that is, reducing the circuit scale and obtaining a high-accuracy voltage.

According to this invention, letting the primary voltage booster circuit be a DC-DC converter circuit, it is possible to determine the drivability of switching elements in such a way as to enable reservation of an inductance current even when the input power supply voltage drops down to about 1V or less, which in turn enables achievement of the voltage rise-up required. More specifically, the intended voltage riseup is achievable as far as it is possible to store in the inductance element a magnetic energy greater than the energy required for the load in a post stage. Additionally, the driver circuit and the voltage controller are simplified in configuration, thereby making it possible to reduce the layout area of the voltage-boost power supply circuitry.

On the contrary, in prior art charge pump circuits, a capacitor is used to store electrical charge. This capacitor has a one-side terminal, to which a pulsate bias voltage is applied for transmission of the charge toward the next step. A diode is provided in each step for avoiding back flow of the charge. A boost voltage corresponding to one step is a voltage equivalent to a difference between the power supply voltage and the diode's forward drop-down voltage. Accordingly, when the power supply voltage decreases to about 1V, the diode voltage becomes a dominant so that the voltage boosting is hardly achievable.

Figure 4:
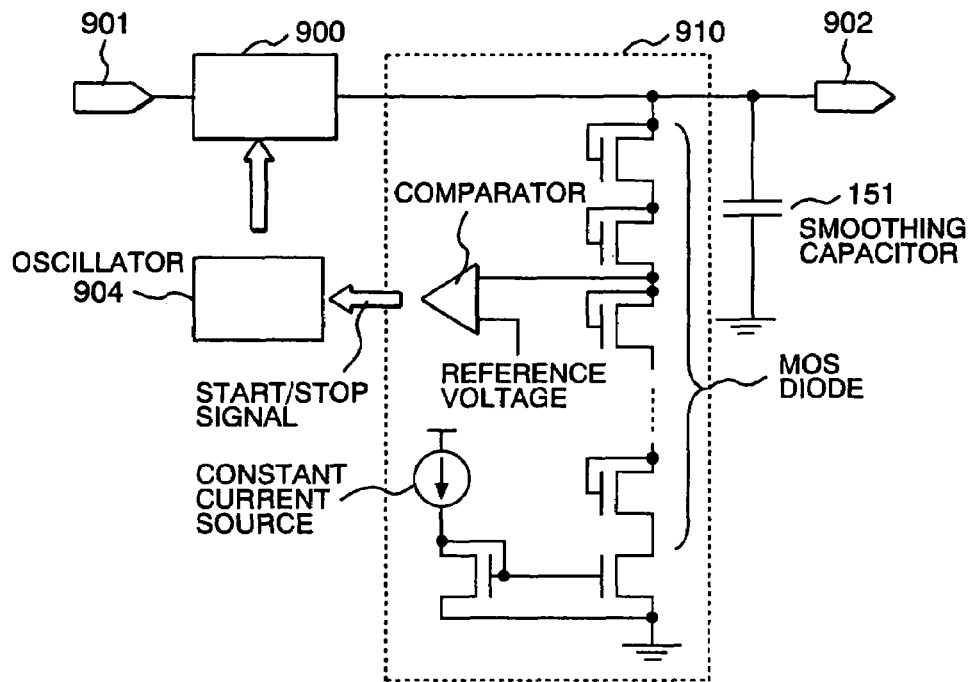
FIG. 4 is a circuit block diagram showing a voltage control means of the semiconductor device in accordance with the invention.

FIG. 4 is a block diagram showing an exemplary voltage control means 910 for controlling the magnitude of an output voltage at the final stage. This voltage control means 910 is arranged to have a serial combination of multiple gate/drain-coupled MOS diodes 920 while letting a sum of their threshold voltages be equal to a predetermined voltage and also causing a current flowing when an output voltage of the Nth booster circuit exceeds a prespecified voltage to become a constant current. A smoothing capacitor 151 is connected to an output terminal of booster circuit 900.

When a voltage that is taken out of the series-connected MOS diodes 920 exceeds a prespecified voltage, a constant current flows, resulting in a comparator 922 generating a stop signal to thereby avoid a potential riseup. On the other hand, when the voltage taken out of the MOS diode 920 becomes lower than a specified voltage, the comparator 922 gives a start-up signal to an oscillator circuit 904, for controlling the voltage of the Nth booster circuit 900 so that its output voltage rises up. Note here that although in this embodiment the voltage controller is provided at the final stage of booster circuitry, such controller may be provided at a location near the final stage—for example, at its front stage—while causing the final stage to have a constant voltage boost ratio.

In this way, the constant current is converted into an appropriate constant voltage, which is then compared by the comparator 922 with a reference voltage. This causes the oscillator circuit 904's output voltage being input to the Nth voltage booster circuit 900 to turn on and off, thereby obtaining a constant voltage with a specified potential level. Accordingly, reduction of the circuit scale becomes possible by controlling only an output voltage of the final stage while roughly handling an intermediate voltage(s) with a fixed boost ratio(s).

Note here that the circuit scale reduction of the gate driver circuit 140 is enabled by making the switching duty ratio constant to provide a fixed voltage boost ratio. The reason of this is as follows. For comparison purposes only, an explanation will first be given of a prior art control scheme of traditionally configured DC-DC converter circuitry for potentially raising an input voltage 6101 shown in FIG. 30 up to an output voltage 6102.

The above-noted gate driver circuit 140 corresponds to a gate control circuit 6140. First, the output voltage 6102 is fed back via a filter 6141. Then, an error between it and an output of a reference voltage generator circuit 6142 is amplified by an error amplifier 6143.

Thereafter, an output of the error amplifier 6143 and an output of a triangle wave generator circuit 6144 are passed to a comparator 6145, which compares them to determine the ON or OFF of the switching element 120 and then send a signal to a gate driver circuit 6146. The gate driver circuit 6146 causes the switching element 120 to vary in ON time ratio, thereby constantly retaining the output voltage.

This requires the use of a circuit block including the filter 6141 for the feedback use, reference voltage generator circuit 6142, error amplifier 6143, triangle-wave generator circuit 6144, comparator 6145 and others. By contrast, in the case of this invention, the DC-DC converter circuit per se does not perform any feedback of an output voltage; instead, let the switching element 120 operate in accordance with a preset switching duty ratio.

Therefore, the above-noted feedback loop configuration is no longer required, and similar results are attainable only by the gate driver circuit along with a circuit for generating a fixed switching duty ratio. Thus, its circuit scale can be reduced.

It is also possible to achieve high-frequency operations because the gate driver circuit 140 becomes simpler in configuration. As a result, the inductance can be selected to have a small value, thereby enabling reduction of the occupation area of the switching element 120.

Although the switching frequency and switching duty ratio are little variable due to deviations in the manufacture of those elements making up the gate driver circuit 140, the intended voltage boosting is attainable even though the gate driver circuit 140 is reduced in scale.

In other words, even in case a second voltage booster circuit 200 at the next stage is a charge pump circuit, what is required is merely that a certain voltage exceeding the barrier of a forward drop-down voltage of a diode can be output from the first-stage booster circuit 100—in this case, the voltage boost ratio determinable by the switching duty ratio may be kept low in accuracy. Additionally, although the scale of the gate driver circuit 140 becomes larger, it is also possible to use a control circuit which stabilizes the switching duty ratio.

Furthermore, there may be provided the means for permitting setup of the switching duty ratio from the outside not only during designing works but also during manufacture and operation. Hereinafter, one example of the duty ratio generating circuit and the duty ratio setting means will be shown in FIGS. 5 to 7.

Figure 5:
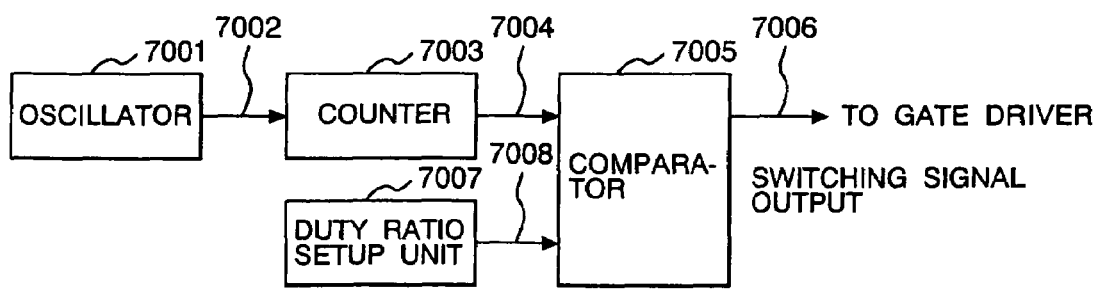
FIG. 5 is a diagram showing, in block form, a configuration of duty-ratio setup means along with a duty-ratio generator circuit of the booster circuit of the semiconductor device in accordance with the invention.

FIG. 5 is a block diagram showing the duty ratio generator circuit using a counter and a comparator. An operation of this circuit is as follows. An oscillator 7001 outputs a rectangle wave signal 7002. A counter 7003 counts up its pulse number and generates a counter output 7004, which is compared by a comparator 7005 to a digital value 7008 that was set by a duty ratio setup unit 7007. Thus a switching signal 7006 with a desired duty ratio is generated.

The switching signal 7006 is input to the gate driver circuit 140 and then amplified to thereby make it possible to drive the switching element 120 and thereafter drive the gate. In case the counter 7003 is a counter with a set of cycle value and switch-on time value and a period being fixed, the set value 7008 may be only the value of the switch-on or off time. In this way, it becomes possible to obtain a desired switching duty ratio even where the duty ratio of the oscillator 7001 is out of management.

Although the explanation was given with reference to the drawing in which the oscillator 7001 for generating the rectangle wave 7002 is laid out as part of the duty ratio generator circuit, when using a plurality of DC-DC converter booster circuits with different boost ratios, an oscillator may be used in common; alternatively, a clock signal being supplied from the outside of an LSI is employable as the rectangle wave 7002.

Optionally, oscillators and duty ratio generator circuits may be provided in all the gate drive circuits of respective voltage booster circuits. Alternatively, it is also possible to make the oscillator common to thereby permit direct input to the booster circuit of the charge pump scheme while individually disposing duty ratio generator circuits in the booster circuits of the DC-DC converter circuit scheme. Obviously, those booster circuits with the same duty ratio may be designed to share a duty ratio generator circuit.

Figure 6:
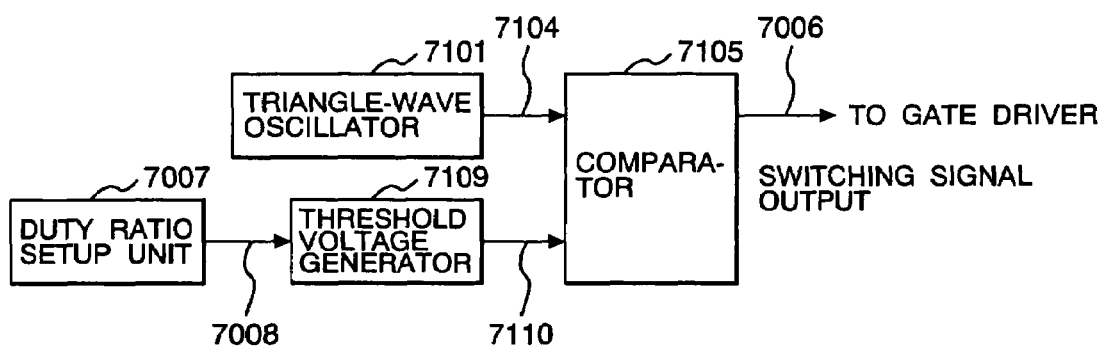
FIG. 6 is a block diagram showing a configuration of a duty ratio generator circuit and duty ratio setup means of the booster circuit of the semiconductor device in accordance with the invention.

FIG. 6 is a block diagram showing a duty ratio generator circuit using an oscillator with a triangle wave output. Based on a value 7008 as set by a duty ratio setup unit 7007, determine a threshold value 7110, which is an output of a threshold value generating circuit 7109. A comparator 7105 compares the threshold value 7110 to an instantaneous value of the triangle wave from a triangle generator 7101, thereby generating a switching signal 7006 that has a desired duty ratio.

Figure 7:
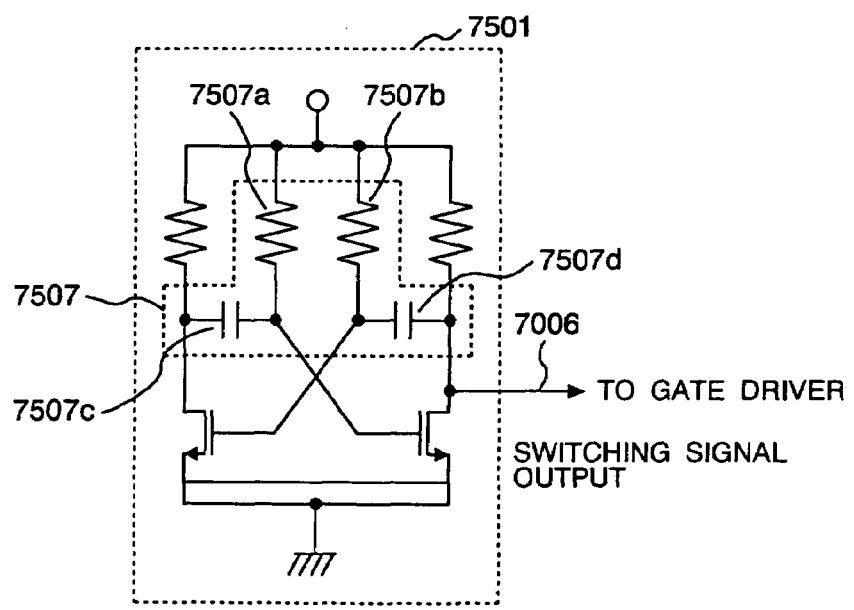
FIG. 7 is a block diagram showing a configuration of a duty ratio generator circuit and duty ratio setup means of the booster circuit of the semiconductor device in accordance with the invention.

An example of the oscillator circuit which can modify the duty ratio of an oscillator per se is shown in FIG. 7. An oscillator 7501 includes a duty ratio setup unit 7507 having two sets of CR delay time constant values (i.e., **7507a*7507c and 7507b*7507d**).

Letting such ratio be t1:t2, the duty ratio of a switching signal 7006 is given by t1:t1+t2. The duty ratio setup unit 7507 is such that a resistor 7507a is adjustable, wherein the other electrostatic capacitors 7507c, 7507d have the same fixed value, and a resistor 7507b also is fixed.

As the duty ratio setup unit 7007 described in FIGS. 6-7, there are two methods which follow: a method for retaining the set value 7008 in a way depending upon the presence or absence of a wiring connection due to a fuse, a wiring mask option, a mask option of contact layout, or a terminal connection option at the time of parts-mounding or the like; and, a method of holding the set value by using a rewritable memory device such as a nonvolatile memory, a register or else. In the case of using the register, it is required that the value be defined upon power-up. To do this, there is considered an arrangement for reading the set value out of a nonvolatile memory or equivalents thereto.

While it is also possible to directly change the resistance value or capacitance value by modifying the wiring connection such as fuses or wiring options or the like, the set value may be provided indirectly. Adversely, in the case of using for the duty ratio setup a value storing means such as a nonvolatile memory or a register, a method may also be available for change-over of a switch element in such a manner as to modify the resistance value or capacitance value based on such the value.

Figure 30:
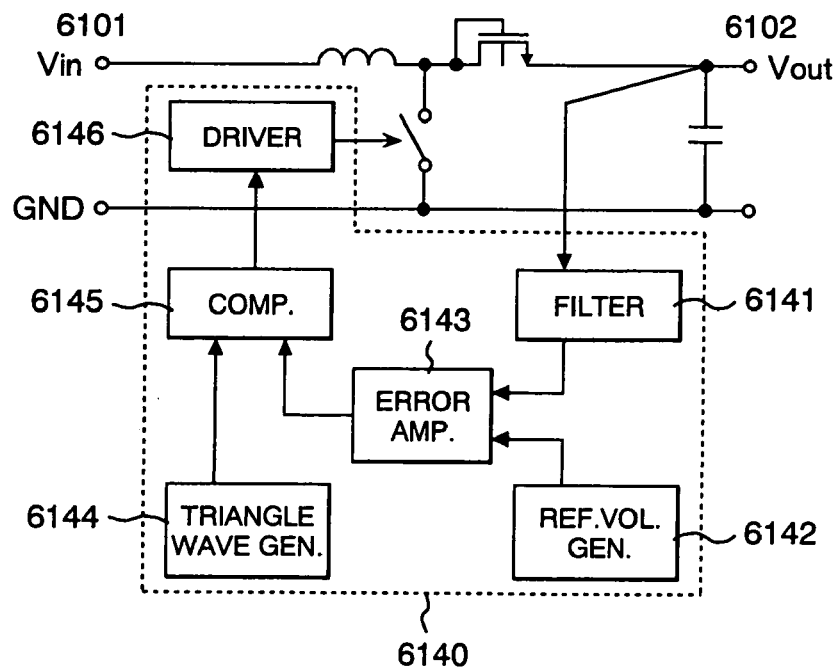
FIG. 30 is a diagram for explanation of prior art gate peripheral circuitry of a DC-DC converter.

The prior art DC-DC converter-used comparator shown in FIG. 30 is required to make up a differential amplifier for the voltage comparison purpose. However, the counter-used comparator of the duty ratio setup scheme embodying the invention shown in FIG. 5 is configurable by logic circuitry and thus is less in circuit area than the differential amp. Although in FIG. 6 such differential amp becomes necessary, phase designs become easier since the duty ratio is directly set up without constituting any feedback control loop.

Although in the embodiments shown in FIGS. 5 to 7 the voltage boost ratio is indirectly determined by the switching duty ratio, there is an approach that a block (not shown) for converting a boost ratio into a duty ratio is provided to thereby use the boost ratio as the set value.

By letting the boost ratio be setup-variable in this way, in cases where an input voltage to a memory LSI is 3V during high-speed operations and drops down at 1V during low power consumption operations, it is possible, by changing the switching duty ratio within the LSI in accordance with a present operation mode, to deal with any change in input voltage while using a simple circuit configuration. It is also possible to fabricate as the same chip a product of the type capable of operating at high speeds and another one operable at low speeds while offering low power consumption and then divide it into different types of chip products by modifying an internal resistor(s) at the time of shipment.

According to the invention, designing the first-stage voltage booster circuit as a DC-DC converter circuit permits determination of the drivability of switching element 120 in such a way that an inductance current is obtainable even when an input power supply voltage decreases to about 1V, whereby the voltage boosting becomes possible. In other words, the boosting is enabled if it is possible to store in the inductance element 110 a magnetic energy greater than the energy required for the load of a post stage.

In addition, the driver circuit and voltage controller also are simplified, thereby reducing the layout area of the voltage-boost power supply circuit. In contrast, the charge pump circuit is such that charge is stored in a capacitor having terminals, one of which is applied a pulsate bias voltage for transferring the charge toward the next step. A diode for preventing the reverse flow of a current is required for each step.

A boosted voltage corresponding to one step is a voltage equivalent to a difference between the power supply voltage and the diode's forward drop voltage. Thus, when the power supply voltage drops down at about 1V, the diode voltage becomes a dominant, resulting in any intended voltage boost becoming almost impossible.

Figure 8:
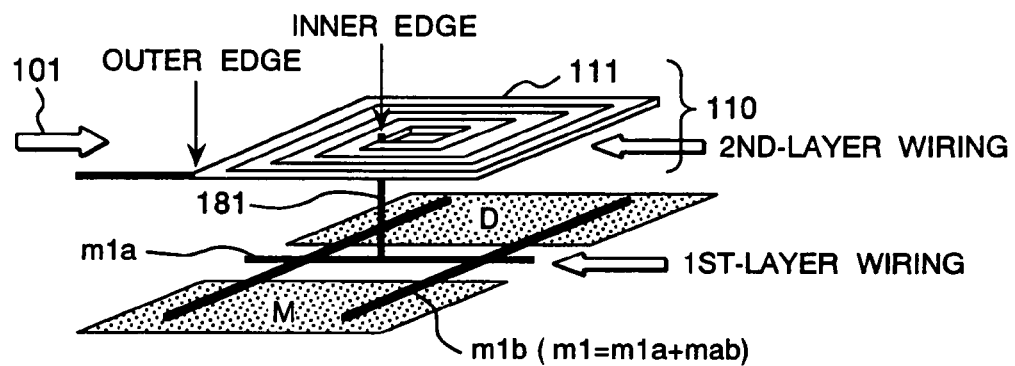
FIG. 8 is a diagram depicting an element layout and a wiring diagram showing a first embodiment of an on-chip converter of the semiconductor device in accordance with the invention.
Figure 9:
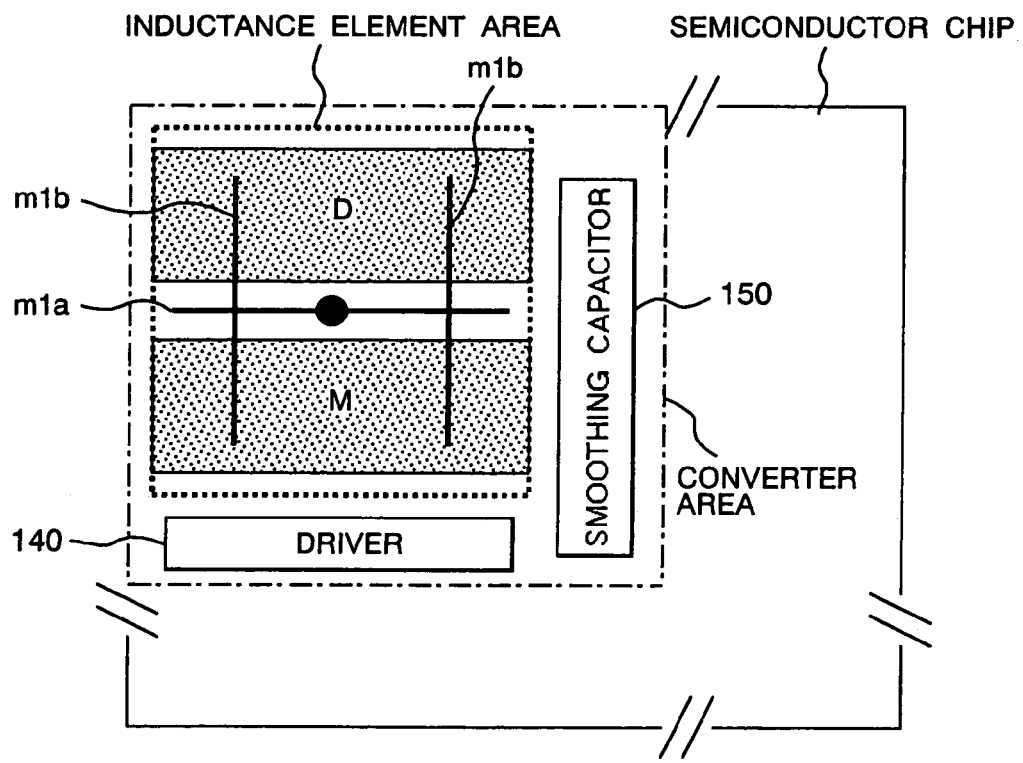
FIG. 9 is a diagram showing a plan view of a first embodiment of the on-chip converter of the semiconductor device in accordance with the invention.

FIG. 8 shows a first embodiment of the on-chip converter of this invention. This diagram depicts the layout of an inductance element 110 making up the on-chip converter and its peripheral elements including a switching element 120 and diode 130, along with a connection relationship thereof, wherein a formation area of the switching element 120 is designated by M whereas that of the diode 130 is denoted by D. In addition, a planar configuration of the first embodiment of the on-chip converter of the invention is shown in FIG. 9. As shown in FIG. 9, the converter is formed in a partial area of a semiconductor chip, for driving an element within the chip (for example, a flash memory element, not shown) after having boosted an input power supply voltage 101 by the circuit shown in FIG. 1 (only a converter part is shown in FIG. 9).

A metal wiring unit 111 which is a first metal wire of the inductance element 110 is obtained by causing either a signal wiring line of a flash memory element within the semiconductor chip of FIG. 9 or a metal wire for use as a power supply wire—in the flash memory element, a metal wire at the second layer for use as a signal wire—to have a spiral shape, wherein a core part of the inductance element 110 is formed of a dielectric film lying between wiring layers and a protective dielectric film.

Traditionally in the case of forming inductance elements within a chip, the resultant series resistance has been reduced by especially adding a process for wiring a thick film with a thickness of several μm or by bonding together those fabricated by separate processes. In this invention, as has been described previously, the inductance element 110 is fabricated in the on-chip fashion without modifying the wiring process of the flash memory, for example.

Details of the structure will be described later with reference to FIGS. 16(a) to 16(c) in the explanation of a parallel-connection type inductance.

A second metal wiring line for supplying the input power supply voltage 101 is connected to an outer peripheral portion of a metal wiring unit 111 of the inductance element 110; an interlayer connection wiring line 181 extending downward from an inner periphery of the metal wiring unit 111 to the substrate side is connected to a first-layer metal wire m1, which is a third metal wire for connecting together diffusion layers (not shown) of switching element 120 and diode 130. The metal wire m1 consists of metal wire components "m1a" and "m1b," wherein m1a extends in a one direction to almost the same extent as one side of the inductance element for subdivision of the formation area M of the switching element 120 and the formation area D of diode 130 with the direction as a boundary, whereas m1b extends from a plurality of portions of m1a in a direction perpendicular to m1a and is then connected to the diffusion layers (not shown) of the switching element 120 and diode 130. For brevity purposes, only those metal wires between the switching element 120 and diode 130 and the inductance element 110 are shown in FIGS. 8-9, with the other wires omitted herein (the same goes with the following drawings expect as otherwise explained to the contrary).

Also note that while the shape of the metal wiring unit 111 of the inductance element 110 is a rectangle in FIG. 8 for simplicity purposes, it may alternatively be designed to have other polygons, such as an octagon or a sixteen-angled polygon. The same goes with the embodiments below.

As in this embodiment, it is possible to lessen the inter-element wiring resistance and parasitic inductance by providing the switching element 120 and diode 130 immediately beneath the inductance element 110 and letting the interlayer connection wire 181 extending downward from the inner periphery of the metal wiring unit 111 to the semiconductor substrate side be connected to the first-layer metal wire m1 for connection between the diffusion layers of the switching element 120 and diode 130. Thus it is possible to downsize the on-chip converter without lowering the power supply efficiency. This also makes it possible to reduce noises during switching operations.

Figure 10:
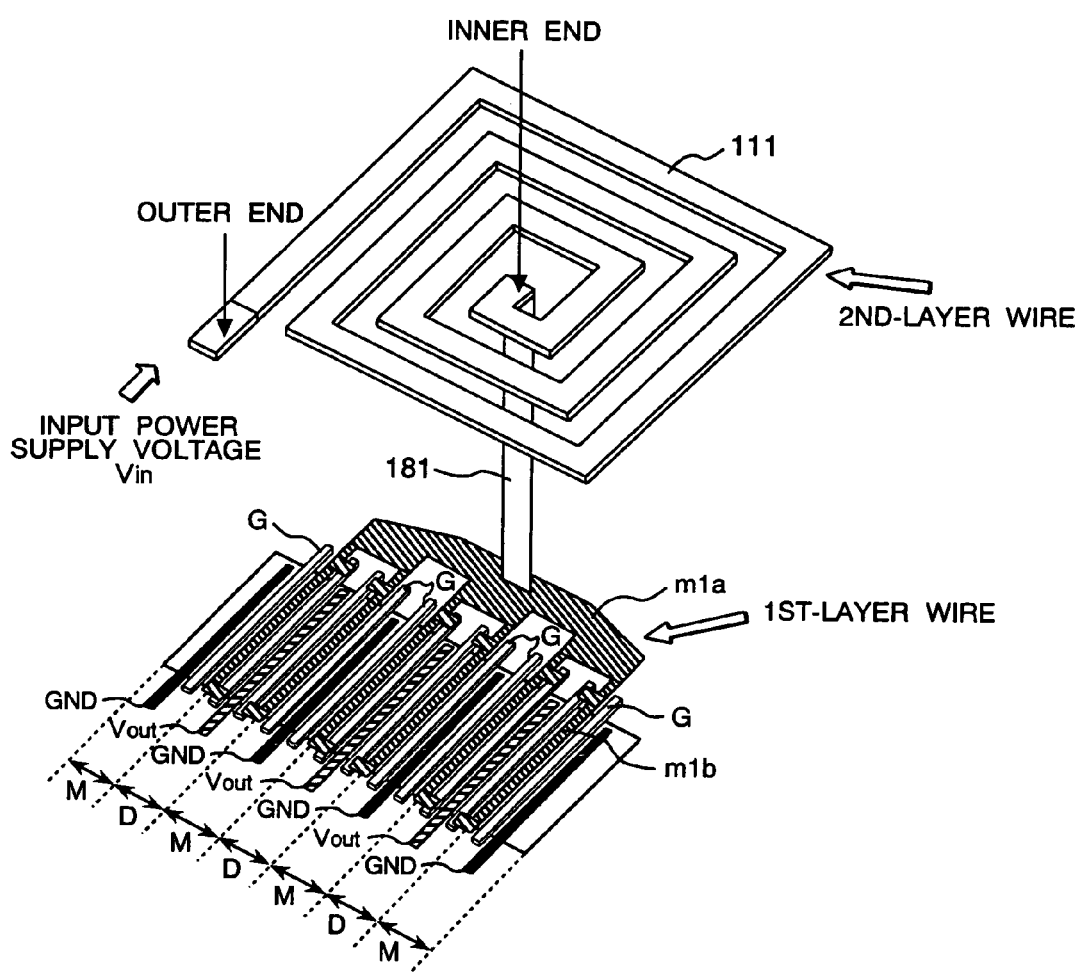
FIG. 10 is a diagram depicting an element layout and a wiring diagram showing a second embodiment of the on-chip converter of the semiconductor device in accordance with the invention.

See FIG. 10, which shows a second embodiment of the on-chip converter of the invention. This diagram depicts the layout of an inductance element 110 making up the on-chip converter and its peripheral elements including a switching element 120 and diode 130, along with a connection relationship thereof, wherein a formation area of the switching element 120 is designated by M whereas that of the diode 130 is denoted by D.

Figure 11:
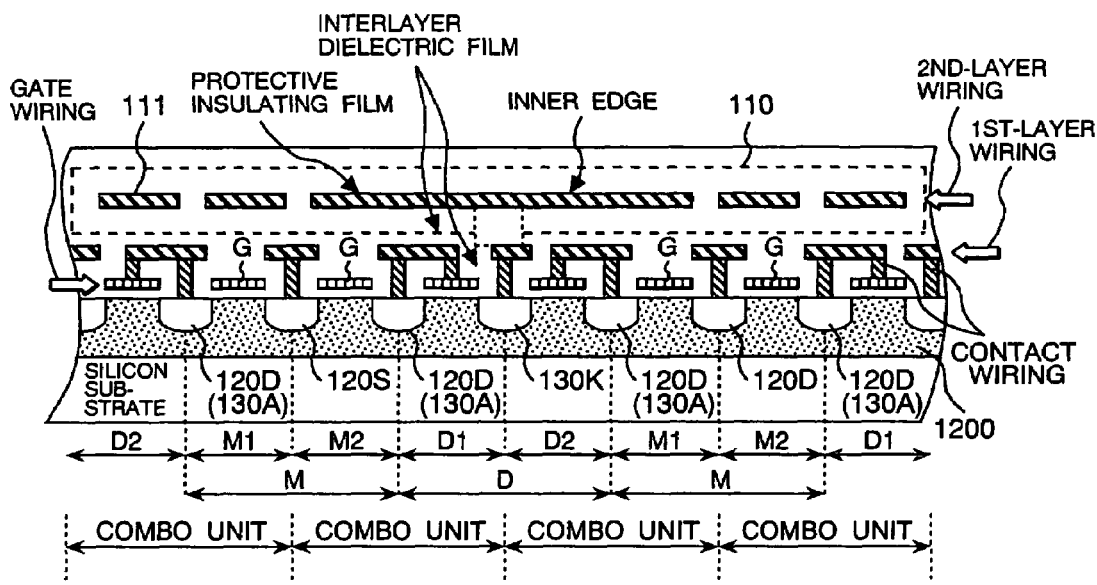
FIG. 11 is a diagram showing a cross-section of the second embodiment of the on-chip converter of the semiconductor device in accordance with the invention.

FIG. 11 is a diagram showing a cross-section of the second embodiment of the on-chip converter of the invention. In FIG. 11, reference numeral 1200 indicates a well diffusion layer in which more than one MOS transistor (switching element 120) and MOS diode (diode 130) are to be formed; 120D and 120S denote those diffusion layers constituting the drain and source regions of each switching element, respectively; and, 130A and 130K are diffusion layers forming the anode and cathode regions of each diode, respectively.

In the formation area M of the switching element 120, two transistors M1 and M2 are provided while sharing a diffusion layer 120S for forming a source region, wherein a first-layer (metal) wiring line that is connected to the diffusion layer 120S via a contact wire is a GND wire being coupled to ground potential. In the formation area D of diode 130, two transistors D1 and D2 are provided while sharing a diffusion layer 130K for forming a cathode region, wherein a first-layer (metal) wiring line that is connected to the diffusion layer 130K via a contact wire is a Vout wire, which becomes an output potential of the converter circuit. A wire G included in the gate wiring lines is a gate portion of the switching element 120, while a wire that is connected to the diffusion layer 120D (130A) via a contact wire and first-layer (metal) wire is a gate portion of the MOS diode 130.

The switching element 120 and diode 130 are each subdivided into a plurality of portions. The drain region of switching element 120 and the anode region of diode 130 are laid out to oppose each other. The both regions are formed in the same diffusion layer 120D (130A). M1 and D2 or M2 and D1 are called a combination unit. The switching element 120 and diode 130 are arranged so that a plurality of sets of such combination units are connected in parallel.

With such an arrangement, the wiring distance between the switching element 120 and diode 130 becomes shortened when compared to the first embodiment shown in FIG. 8, resulting in likewise decreases in wiring resistance and parasitic inductance. Thus it is possible to downsize the inductance element and also reduce switching noises.

As has been stated above, it is possible to lessen the inter-element wiring resistance and parasitic inductance by providing the switching element 120 and diode 130 immediately under the inductance element 110 and letting the interlayer connection wire 181 extending downward from the outer periphery of the metal wiring unit 111 toward the substrate side be connected to the first-layer metal wire m1 for connection between the diffusion layers of the switching element 120 and diode 130. Thus it is possible to downsize the on-chip converter without lowering the power supply efficiency. This also makes it possible to reduce noises during switching operations.

Figure 12:
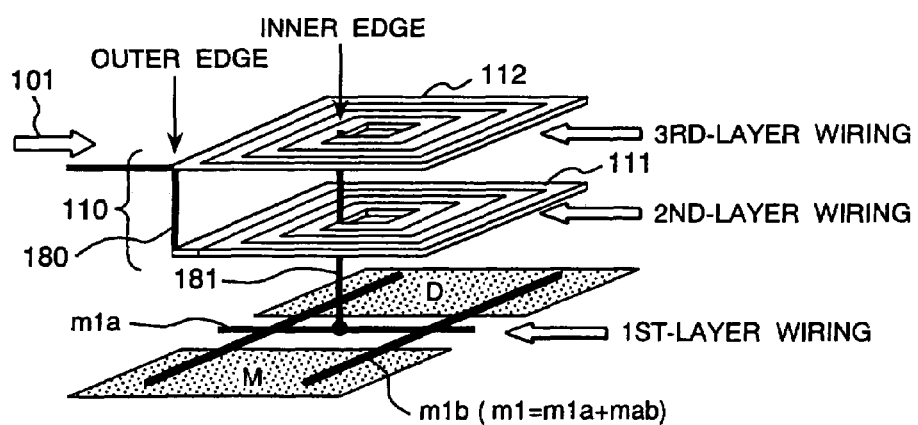
FIG. 12 is a diagram depicting an element layout and a wiring diagram showing a third embodiment of the onchip converter of the semiconductor device in accordance with the invention.

A third embodiment of the on-chip converter of the invention is shown in FIG. 12. This embodiment is such that a plurality of metal wiring units are provided, each of which is similar to that of the inductance element 110 shown in FIG. 8. As stated in the previous embodiment (FIG. 8), metal wiring units 111, 112 are formed by using, with no changes, certain ones of metal wires for use as signal wires or power supply wires of a flash memory element within a semiconductor chip—in the flash memory element, second- and third-layer metal wires for use as signal and power supply wires, respectively.

Very importantly, the metal wiring units 111, 112 of spiral-shaped inductance elements with the same planar shape at a plurality of different wiring layers are formed so that these overlap each other while permitting penetration of magnetic fluxes therebetween and also letting the magnetic fluxes occurring in the case of flow of a current therein be the same in direction. In the case of parallel connection of inductance elements of a single wiring layer in a layout which prevents mutual interference of the magnetic fluxes, the resultant resistance becomes equal to 1/k (where, k is the number of parallel-connected inductance elements); however, the inductance value also decreases to 1/k. By such superposition while allowing the magnetic fluxes to mutually penetrate in the same direction, it is possible to make the inductance value almost equal to the inductance element per layer while letting the resistance be 1/k. Whereby, it becomes possible to micro-fabricate and integrate those inductance elements of low resistance on a chip (although not specifically depicted, respective layers may be connected together at their equal-potential portions by using through-going holes or the like).

Figure 13:
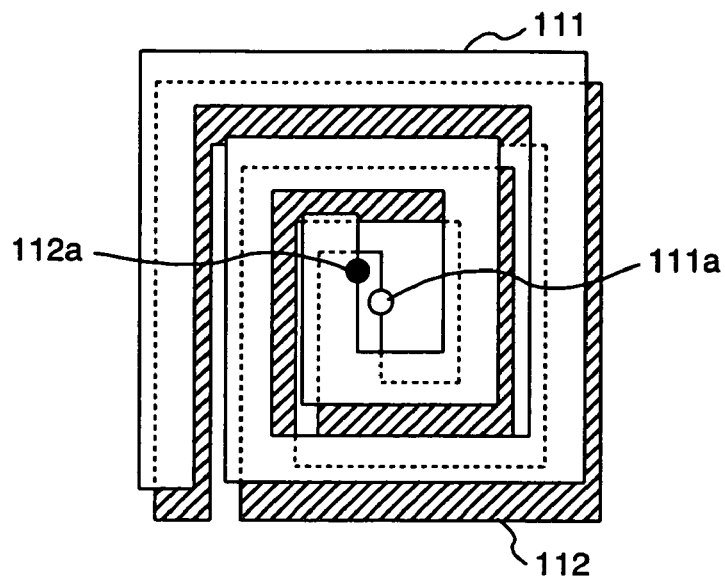
FIG. 13 is a diagram showing another configuration example of an inductance element in the third embodiment of the on-chip converter.

The metal wiring units 111-112 that form the parallel-connected inductance elements are not always formed to have the same shape and same size; for example, the shape of 111 may be modified to a rectangle whereas the shape of 112 is altered to an octagon as far as the mutual penetration of magnetic fluxes is available. Additionally as shown in FIG. 13, unless spiral center points 111a, 112a of 111 and 112 are mutually offset from the other spiral-shaped metal wiring units upon projection of 111 onto 112, the center points may not necessarily be identical to each other.

It is also possible, by the use of such multilayer-wired parallel-connected inductance elements, to suppress an increase in resistance otherwise occurring due to skin effects when the switching element 120 is designed to perform high-speed operations. In order to further minimize the inductance element, high-frequency switching is required. However, skin effects appear when the frequency exceeds 20 MHz, resulting in current concentration only at the surface of a conductor. In this case, even when low-resistance inductance elements are designed using the wiring with a thickness of several μm, the current can hardly flow in an entirety of the conductor cross-section so that the resistance increases in value. But, in the inductance element made up of a plurality of parallel-coupled wiring layers, its conductor surface area is greater than that of thick-film wires even in case a total cross-sectional area is the same. Thus there is an advantage that an increase in resistance due to skin effects is suppressed or minimized.

Figure 14:
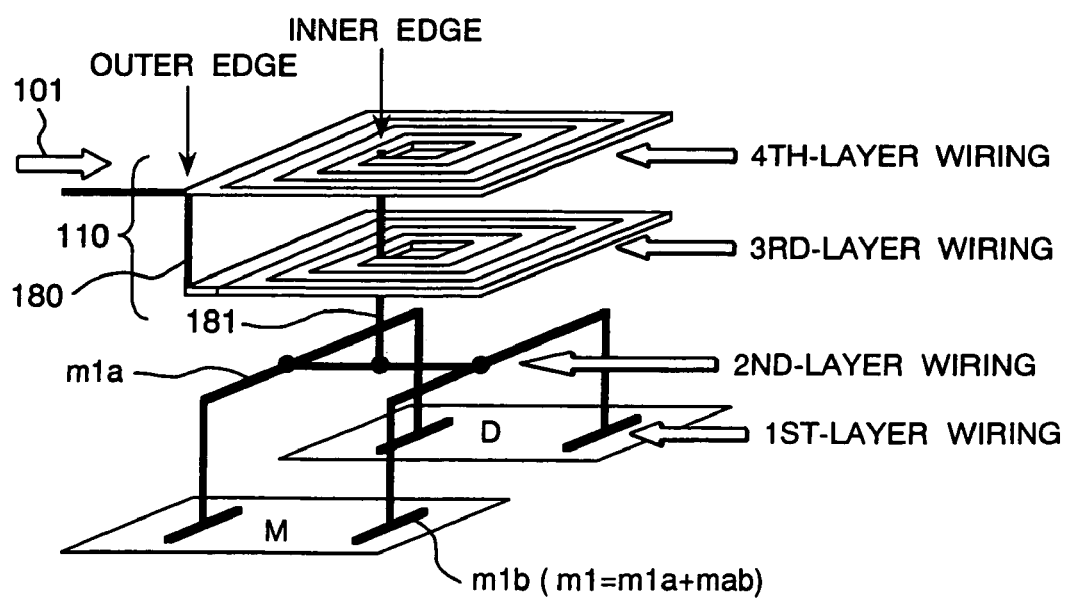
FIG. 14 is a diagram depicting an element layout and a wiring diagram showing a fourth embodiment of the onchip converter of the semiconductor device in accordance with the invention.

A fourth embodiment of the on-chip converter of the invention is shown in FIG. 14. This embodiment is the one that forms the metal wiring units 111 and 112 of FIG. 12 by a third-layer and four-layer wiring lines respectively while using the first- and second-layer wires to form a metal wire m1 for connection between the diffusion layers (not shown) a switching element 120 and diode 130. This is advantageous for reducing the wiring resistance between the metal wiring units and the switching element and/or diode when the first-layer metal wires are relatively large in sheet resistance.

Figure 15:
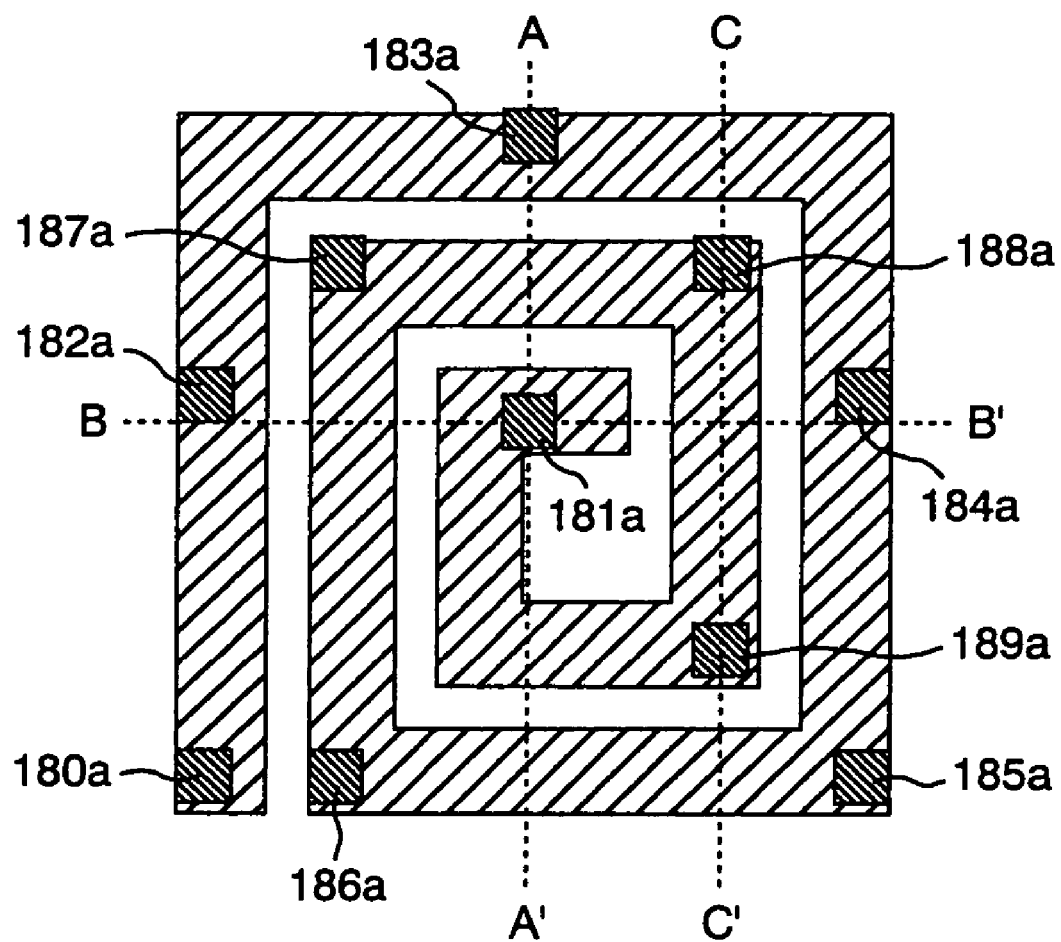
FIG. 15 is a diagram showing a one plane of an on-chip inductance element of the semiconductor device in accordance with the invention.

A plan view of the metal wiring unit 111 of the inductance element shown in FIG. 12 is shown in FIG. 15. Its cross-sectional views along line A-A', B-B' and C-C' are shown in FIGS. 16(a) to 16(c), respectively.

In FIG. 15, reference characters 180a to 189a indicate connection nodes of interlayer connection wires 180-189 and metal wiring unit 111, respectively.

Figure 16A:
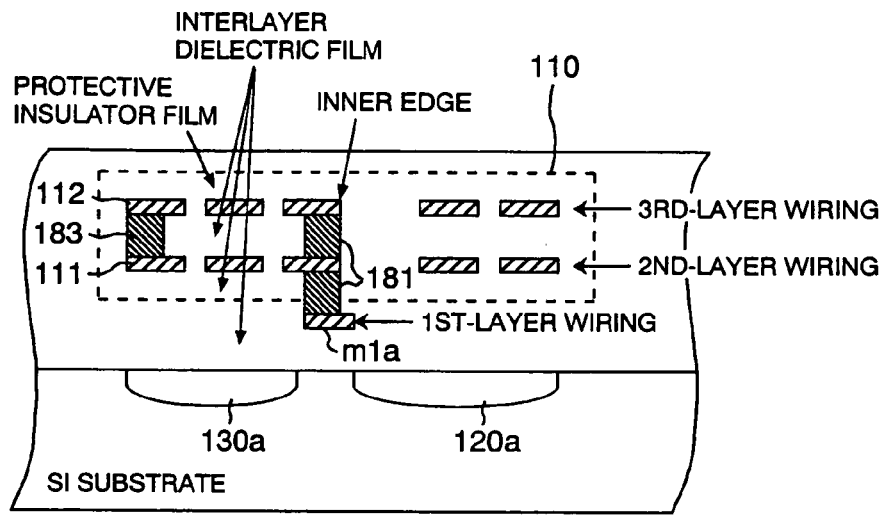
FIGS. 16A to 16C are diagrams each showing a cross-sectional view of the third embodiment of the onchip converter of the semiconductor device in accordance with the invention.
Figure 16B:
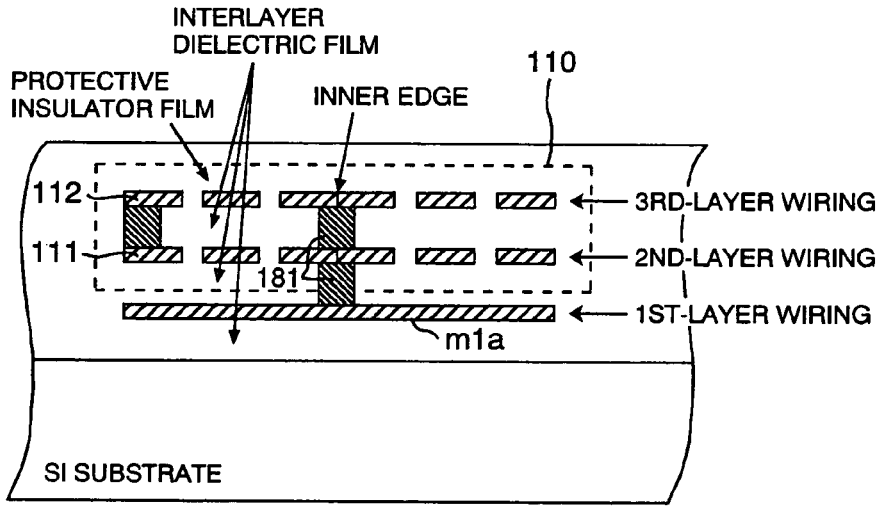
Figure 16C:
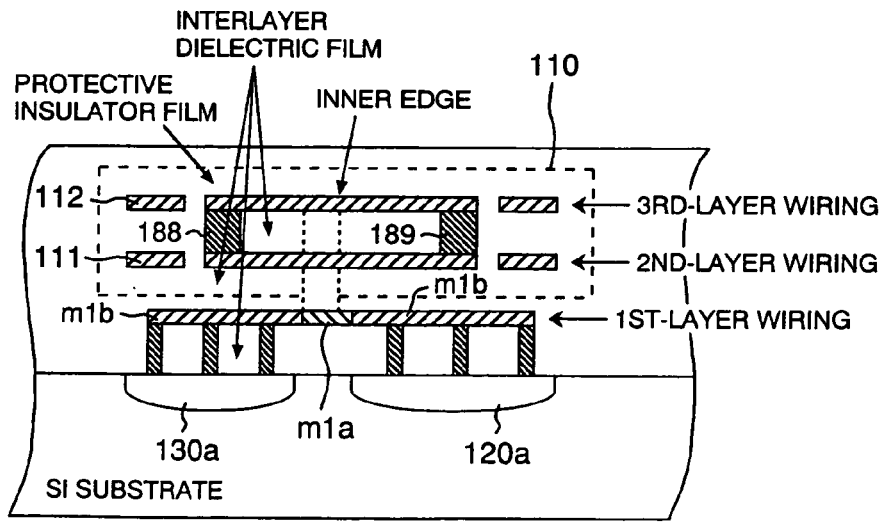

In each of FIGS. 16(a)-16(c), the inductance element 110 is a parallel-connection type inductance element which is made up of second- and third-layer metal wires, an inter-wiring layer dielectric film provided between these layers, and a protective insulating film. More specifically, the illustrated example is an inductance of the type having a parallel connection of a plurality of layers structured from the metal wires and the inter-wire dielectric film. The inductance element-forming metal wires are spiral-shaped wiring lines consisting of a plurality of metal wiring layers such as shown in FIG. 12 and FIG. 15, wherein an input power supply voltage 101 is supplied to the outer periphery of such spiral wiring structure. At each spiral wire, outer peripheral portions are connected together by an interlayer connection wiring line 180, wherein an interlayer connection wire 181 extending downward from the inner periphery toward the substrate side intersects the first-layer metal wire m1a (see FIG. 16(a)). The metal wire m1a extends in a B-B' direction by a degree that is substantially the same as one side of inductance element (see FIG. 16(b)). With the metal wire m1a as a boundary, the formation area M of switching element 120 (120a of FIG. 16) and the formation area D of diode 130 (130a of FIG. 16) are divided so that a metal wire m1b extends from multiple portions of m1a in a C-C' direction (see FIG. 12) while letting it be connected to the diffusion layers (not shown) of switching element 120 and diode 130 (FIG. 16(c)).

Figure 17:
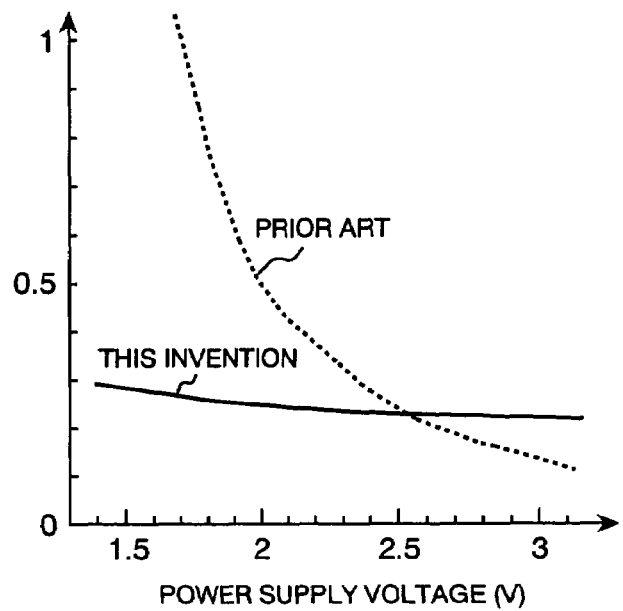
FIG. 17 is a graph showing a relationship of an area ratio versus power supply voltage of booster circuitry of the semiconductor device in accordance with the invention, along with that of a prior known booster circuit.

FIG. 17 is a graph showing, regarding the voltage booster circuit embodying this invention and one prior art booster circuit, the relationship of an area ratio versus power supply voltage when primarily boosting a voltage to 7V. In the prior art booster circuit using a charge pump circuit, its circuit area increases with a decrease in power supply voltage, resulting in a rapid increase of area when the power supply voltage is less than or equal to 2V. In contrast, using the booster circuit of the invention results in no appreciable increase in circuit area—the area becomes smaller than the prior art circuit scheme at about 2.5V. The reason for the prior art booster circuit's area rapidly becoming larger when the supply voltage is at 2V or less is as follows: in the charge pump circuit, a boosted voltage per pump becomes a voltage equivalent to a difference between the supply voltage and the drop-down voltage of MOS diode (about 1V or more under the influence of a substrate bias) so that the stage number of charge pump circuits required for the intended voltage boosting increases. In contrast, the invention is such that in case a primary booster circuit output voltage 102 is about 7V, the intended voltage boosting is achievable by a single stage, so it is almost free from the influence from the MOS diode drop voltage.

Figure 18:
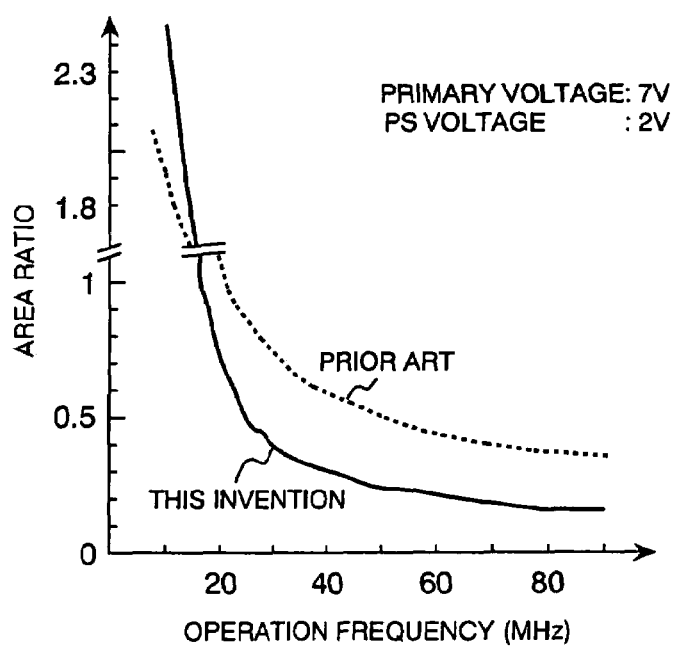
FIG. 18 is a graph showing a relation of area ratio versus operation frequency of the semiconductor device in accordance with the invention, along with that of a prior art booster circuit.

FIG. 18 is a graph showing, as for the voltage booster circuit of this invention and prior art booster circuit, the relationship of an area ratio versus operation frequency when primarily boosting a voltage to 7V. When the operation frequency of booster circuit becomes about 10 MHz or higher, the booster circuit of the invention is less in size than the prior art booster circuit. The reason of this is as follows. Whereas the size of a capacitor that almost determines the size of charge pump is in inverse proportion to the pump's changeover operation frequency, the size of inductance element that almost determines the size of DC-DC converter circuit is in inverse proportion to the square of switching frequency.

Figure 19:
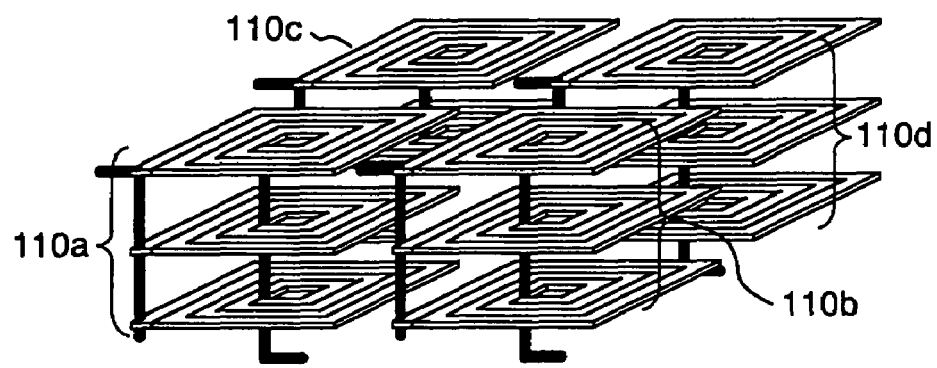
FIG. 19 is a diagram depicting an element layout and a wiring diagram showing a fifth embodiment of the on-chip converter of the semiconductor device in accordance with the invention.

A fifth embodiment of the on-chip converter of the invention is shown in FIG. 19. Although the layout of switching element 120 and diode 130 is not depicted for simplicity purposes only, four circuit units are laid out, each of which is similar in configuration to the converter shown in FIG. 12 with its size made smaller. The maximum consumed current and average current of the DC-DC converter circuit shown in FIG. 2 are determinable by an inductance current IL: the maximum current becomes larger and is about two times greater than the average current. Due to this, the load of a flash memory relative to an input power supply increases in some cases.

Figure 20:
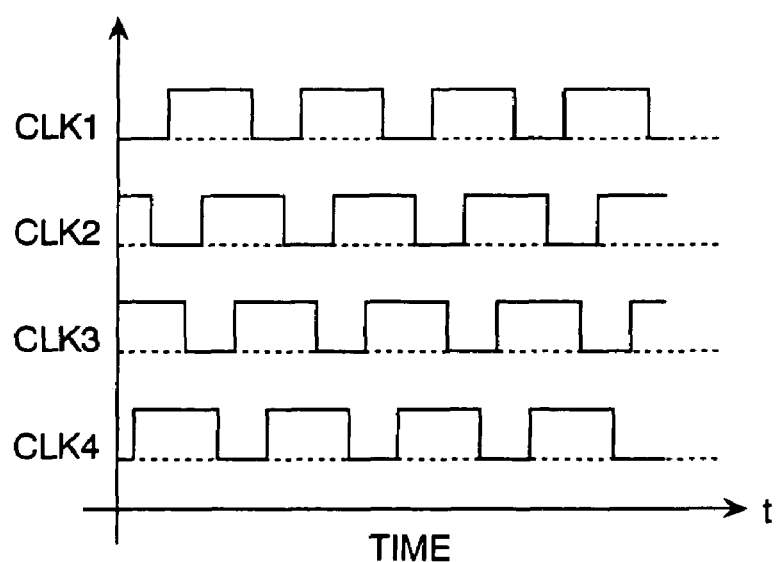
FIG. 20 is a diagram showing clock waveforms during a parallel switching operation of inductance elements in the fifth embodiment of the onchip converter of the semiconductor device in accordance with the invention.

To avoid this risk, as shown in FIG. 19, the inductance element 110 of FIG. 12 is divided into a plurality of sets (in FIG. 19, four sets 110a, 110b, 110c and 10d) in such a manner that its total inductance value becomes the same, while providing four switching elements for causing them to perform operations in parallel with a difference in switching phase as shown in FIG. 20, thereby reducing a peak of a total of inductance currents.

Suppose that the area of a single inductance element is set at 1/k. In the case of a k-parallel operation, the average current becomes the same as that prior to k division when letting the switching frequency be $(k^3)^{1/2}$ times. The maximum current of each phase becomes 1/k, and its sum becomes less than 1; thus, it becomes possible to reduce the total maximum current. Furthermore, when performing the parallel operation with the phase of each switching be offset by 1/k of the cycle or period, it is possible to minimize a total of inductance currents, which in turn makes it possible to reduce the maximum current.

Although the relationship of the voltage boost ratio and the switching duty ratio has been stated supra, when operating while letting this boost ratio (=an inverse number of the switching duty ratio) and the booster circuit parallel division number be the same and also providing a phase difference to ensure equal division of the switching period, ripples of the total current of each phase disappear whereby it is possible to permit the average current and the total maximum current to be almost identical to each other. Additionally, in the case of such division, the inductance element layout increases in flexibility. For example, the layout is enabled not only for quadrate areas but also for rectangular areas.

Figure 21:
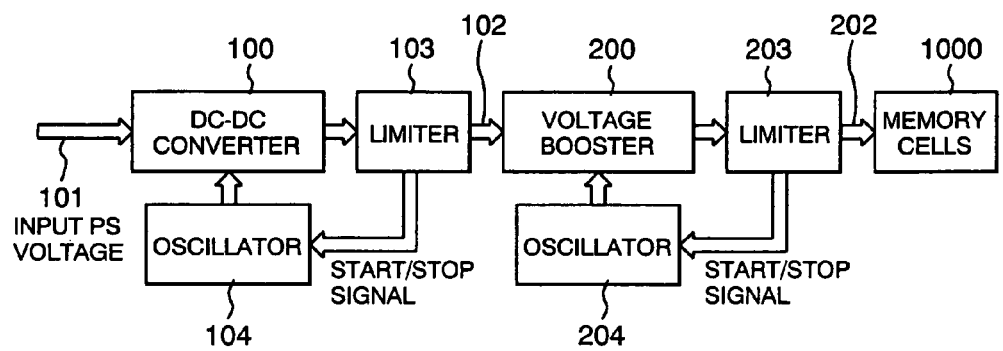
FIG. 21 is a diagram showing another embodiment of the booster circuit of the semiconductor device in accordance with the invention.

FIG. 21 shows the embodiment of FIG. 1 in the case of N=2, with a limiter 103 being disposed at the output of first-stage voltage booster circuit 100. In this case, the voltage boosting is pre-advanced to an intermediate stage in preparation for startup of an operation of the second-stage booster circuit 200. This enables acceleration of the voltage boosting operation as a whole, resulting in an improvement in memory access speed. Note that limiters 103, 203 used herein may be designed to employ the same circuit scheme as that explained as one example of the voltage control means 910 of FIG. 1.

Figure 22:
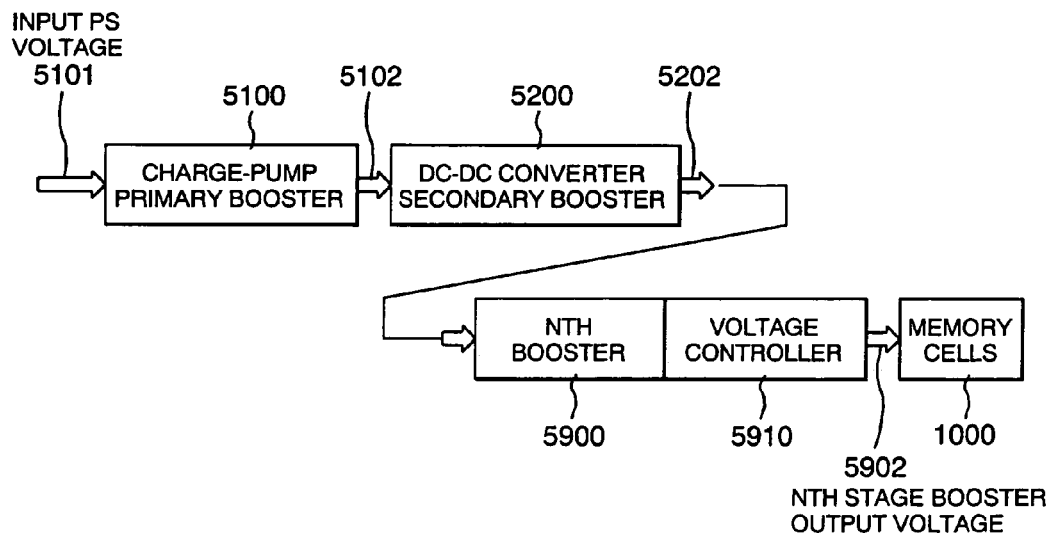
FIG. 22 is a diagram showing still another embodiment of the booster circuit of the semiconductor device in accordance with the invention.

FIG. 22 is a diagram showing a configuration of internal voltage boosting circuitry of a flash memory, which is another embodiment of the invention. While the flash memory includes its internal power supply unit with voltage boosting ability which outputs a plurality of voltages for supplement to a memory cell or cells, part of it will be explained in this embodiment. An input power supply voltage 5101 to the flash memory is input to a first-stage voltage booster circuit 5100.

A second-stage voltage booster circuit 5200 is connected to an output of the first-stage booster circuit 5100; similarly, those up to an Nth-stage booster circuit 5900 are sequentially connected in series. The Nth-stage booster circuit 5900 has a voltage control means 5910 for control of its output voltage, which in turn is connected to a memory cell array 1000. The first-stage booster circuit 5100 is a charge pump circuit, while the second-stage booster circuit 5200 is formed of a DC-DC converter circuit.

Although not depicted herein, third-stage to Nth-stage booster circuits 900 are each configurable from a voltage-increasable DC-DC converter circuit or a charge pump circuit. In case an input power supply voltage Vin is potentially raised up to "a" times by using a charge pump circuit for the first-stage booster circuit, an input maximum current Iin2 of the second-stage booster circuit is given as Iin2=a*Vin/Rdc, where Rdc is the current resistance of an inductance element and switching element.

Letting the inductance value be L, the storable energy is represented by ½L*Iin2*Iin2, so the storing energy is square times greater than "a" when compared to the case of directly supplying the input power supply voltage to the DC-DC converter circuit. For this reason, the first-stage booster circuit is designed using a charge pump circuit while letting the second-stage booster circuit be a DC-DC converter circuit, thereby enabling arrangement of voltage booster circuitry with enhanced efficiency.

It should be noted that when the first-stage booster circuit is made higher in voltage boost ratio than the second-stage booster circuit, the resulting area will possibly increase due to an increase in scale of charge pump circuits. To avoid this risk, it is required that the second-stage booster circuit be greater in boost ratio than the first-stage booster circuit.

Figure 23:
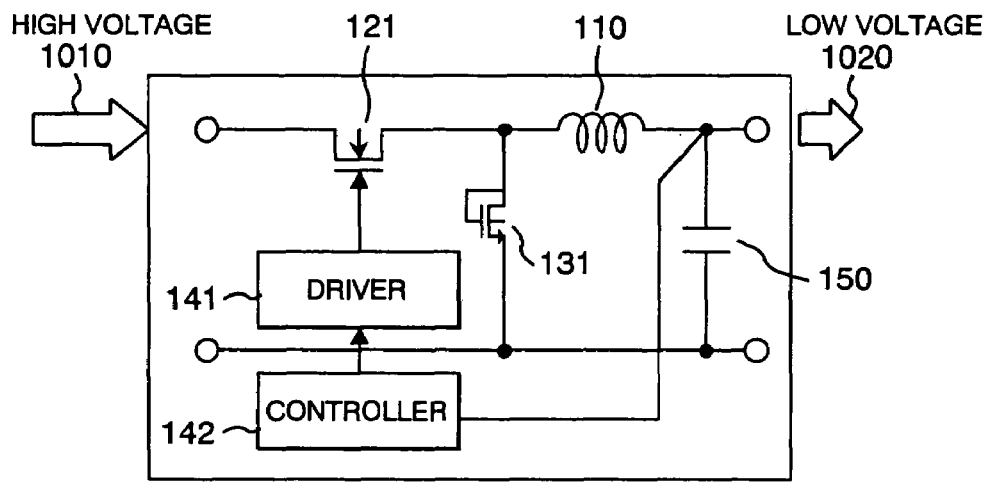
FIG. 23 is a diagram showing a one embodiment of the potential drop-down circuit of the semiconductor device in accordance with the invention.
Figure 24:
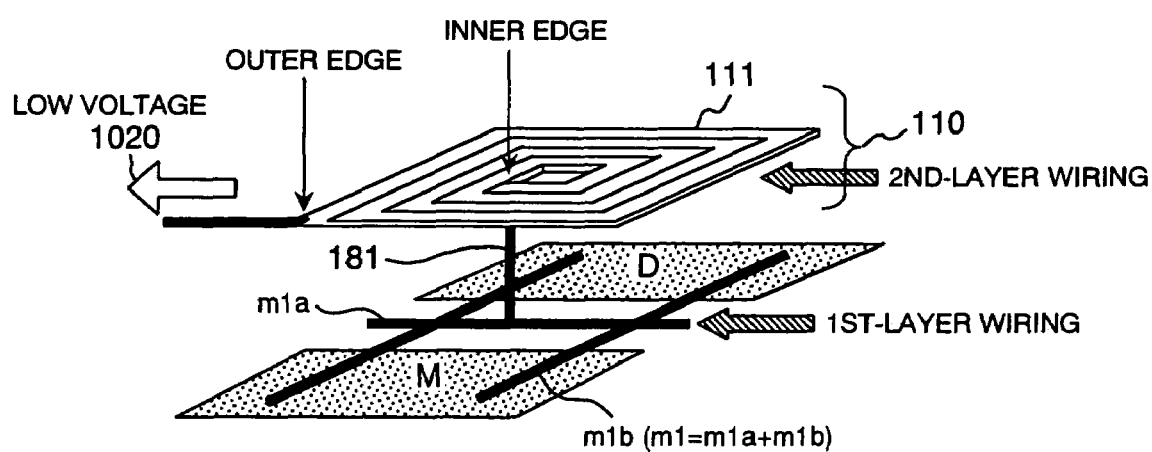
FIG. 24 is an element layout and wiring diagram showing the fifth embodiment of the onchip converter of the semiconductor device in accordance with the invention.

An embodiment of a voltage drop circuit using the on-chip converter of this invention is shown in FIG. 23. This converter circuit is configured from an inductance element 110, switching element 121, diode 131, switching element gate driving circuit 141, control circuit 142 for control of an output voltage, and output-smoothing capacitor 151. A high voltage 1010 being input to this converter circuit will be output as a prespecified low voltage 1020.

While the onchip converter-forming inductance element 110 and its associated switching element 121 and diode 131 are almost similar, in layout and wiring along with planar and sectional configurations, to those shown in FIGS. 8, 10, 12 and 14 and FIGS. 9, 11 and 16(a)-16(c), except for the polarities of elements, the metal wiring unit 111 of inductance element 110 is connected to a fourth metal wire for output of a potentially reduced voltage, rather than the wiring line for supplying the input power supply voltage 101.

Additionally, in the case of using an arrangement with a parallel connection of multiple sets of combination units of switching elements 121 and diodes 131 in a similar manner to the configuration shown in FIG. 11, these combination units are disposed on a semiconductor chip so that the source region of a switching element and the cathode region of a diode oppose each other while letting the both regions be electrically connected together.

It is noted that the voltage drop circuit of this embodiment may be arranged to have a plurality of stages as in the voltage booster circuit 100, 200, 900 shown in FIG. 1.

In short, a semiconductor device is configurable, which permits an input voltage to be potentially dropped down by a primary voltage drop circuit or a group of multiple stages of voltage drop circuits each using it, and which has a voltage control unit for controlling a final dropped output voltage to be output from a voltage drop circuit at the final stage.

Figure 25:
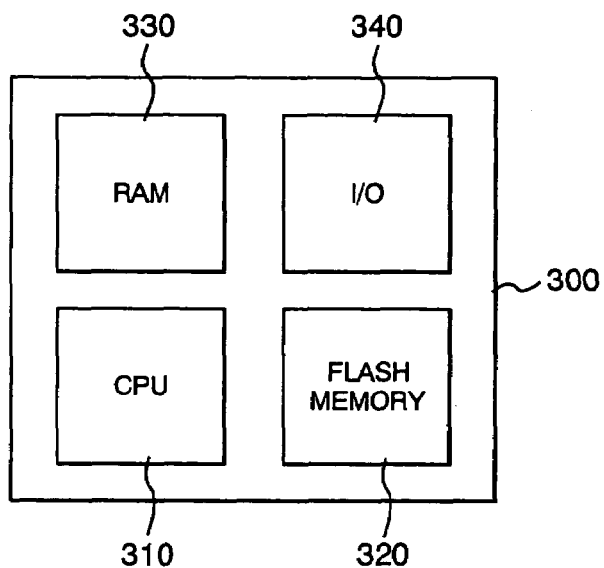
FIG. 25 is a diagram showing a configuration of a microcomputer chip with built-in flash memory using the onchip converter of the invention.

FIG. 25 shows a configuration of a microcomputer with a built-in flash memory using the onchip DC-DC converter of this invention. The flash memory-embedded microcomputer 300 is generally made up of a CPU 310, flash memory 320, RAM 330, and I/O unit 340. The I/O unit 340 includes a serial I/O, programmable input/output port, analog-to-digital converter (ADC), and digital-to-analog converter (DAC) and others. The flash memory 320 uses the booster circuit shown in FIG. 1 and the onchip converter shown in FIG. 4, by way of example.

Figure 26:
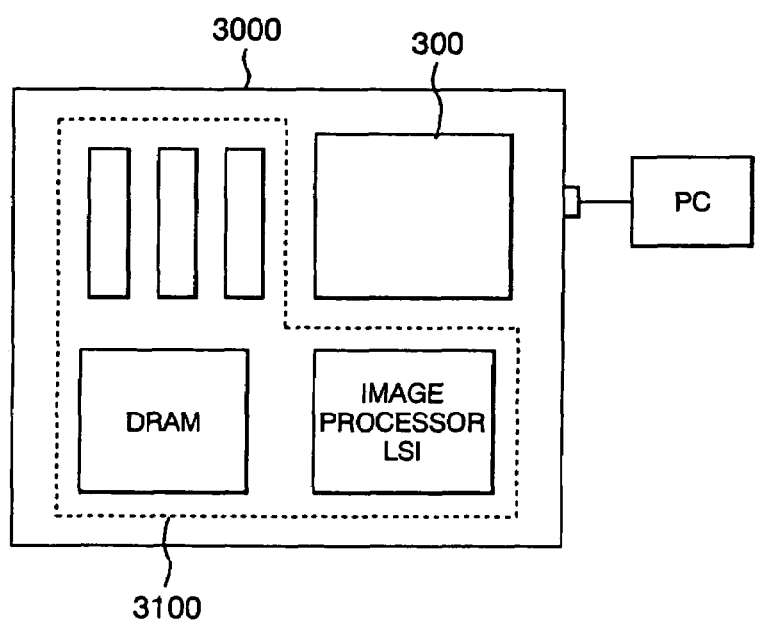
FIG. 26 is a diagram showing a configuration of a system board using a microcomputer chip with built-in flash memory using the on-chip converter of the invention.

FIG. 26 shows a configuration of a system board 3000 having the flash memory-embedded microcomputer 300 using the onchip converter of the invention. The system board 3000 has, other than the flash memory-embedded microcomputer 300, an LSI for the application system use, which is an object to be controlled by the microcomputer, and built-in discrete components 3100. The system board 3000 is connected by a serial I/F or else to a personal computer (PC) 3200 so that an application program of the application system is sent from the PC 3200 and then written into the built-in flash memory 320 of the flash memory-embedded microcomputer 300.

The flash memory-embedded microcomputer 300 indicated in this embodiment is widely adaptable for use as an in-vehicle microcomputer for performing engine control and body control operations, a plasma display panel (PDP), and a system-control microcomputer such as DVD-related equipment.

Figure 27:
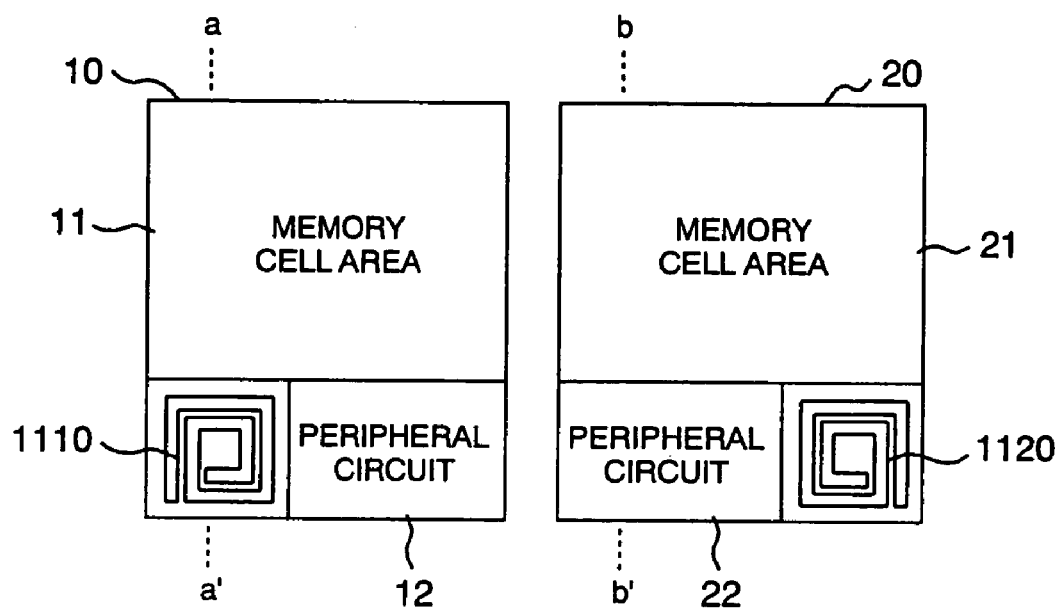
FIG. 27 is a diagram showing one embodiment of a multi-chip type semiconductor device using the semiconductor device in accordance with the invention.
Figure 28:
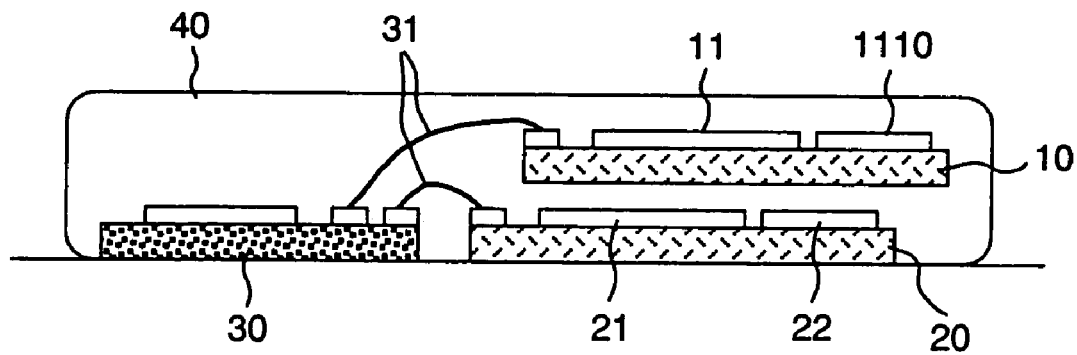
FIG. 28 is a diagram showing one embodiment of a memory card using the semiconductor device in accordance with the invention.
Figure 29:
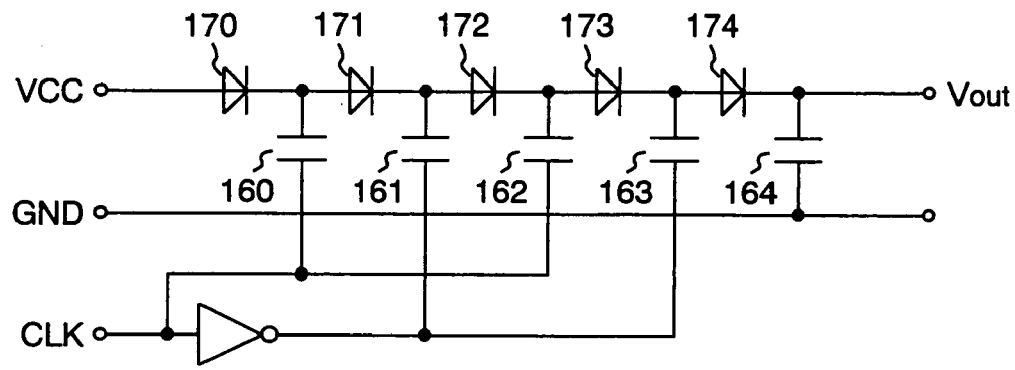
FIG. 29 is a diagram showing one exemplary prior art voltage booster circuit of the type using the charge pump scheme.

FIG. 27 is a diagram showing an internal block arrangement of two types of semiconductor devices 10 and 20 to be used during packaging with a plurality of semiconductor devices of the invention being stacked over one another. FIG. 28 schematically shows a cross-sectional structure of a multi-chip type semiconductor device with the semiconductor devices 10 and 20 being stacked into the form of a card. In FIG. 27, numeral 10 designates a first semiconductor device; 20 denotes a second semiconductor device; 11, 21 is a memory cell area; 12, 22 is a peripheral circuit area; 1110, 1120 is a voltage booster circuit area which includes the primary booster circuit 100 of the invention stated supra. Here, the semiconductor device 20 has a configuration that is obtained by mirror-like inversion of the element layout of the semiconductor device 10. Owing to this, the inductance element 110 residing within the booster circuit area 1110 of semiconductor device 10 is provided in the left-half area of a chip, whereas the inductance element 110 within the booster circuit area 1120 of semiconductor device 20 is provided in the right-half area of the chip. In FIG. 28, numeral 40 denotes a memory card; 30 is a CPU; 31, bonding wires for interconnection between electrode pads of the first semiconductor device 10 and second semiconductor device 20. The semiconductor devices 10, 20 are stacked over each other so that their a-a' and b-b' cross-sections each become the cross-section of FIG. 28. For example in FIG. 28, a part of the booster circuit area 1110 of semiconductor device 10, which is at the deep end of the drawing sheet, becomes the peripheral circuit area 12.

An arrangement of a memory card employing the memory card using the voltage booster circuitry of the invention will be described below.

This invention provides an arrangement comprising a plurality of semiconductor devices and a controller CPU, each of which devices includes a semiconductor device comprising a plurality of stages of voltage booster circuits for potentially raising a power supply voltage up to a predetermined final output voltage, a voltage control unit connected to a voltage booster circuit near its final stage for control of a final output voltage, and more than one internal element to which the final output voltage is supplied, wherein a first stage of voltage booster circuit includes a converter circuit having an inductance element, a switching element, a diode and a driver circuit for driving the switching element, and wherein the switching element and diode are partly laid out to underlie the inductance element. Each semiconductor device is connected by bonding wires to the CPU and is disposed so that it is superposed with the others. Inductance elements within neighboring semiconductor devices are arranged so that those inductance elements within the other semiconductor devices are disposed not to mutually overlap in the direction immediately above and beneath the inductance elements.

In the case of packaging of the plural semiconductor devices in a stacked manner, it can sometimes happen that the operations become unstable due to the interference of magnetic fluxes as created from inductors between neighboring semiconductor devices. If this is the case, let the first and second semiconductor devices such as shown in FIG. 27 be superposed together as shown in FIG. 28, whereby the inductance elements do not overlap each other in the up-down directions. Thus the interference of magnetic fluxes no longer take place.

It should be noted that although in the above embodiment the semiconductor device embodying this invention has been explained by taking a flash memory as an example, the invention may also be applied to any other devices that are arranged so that a voltage higher than the power supply voltage is generated by internal circuitry for driving internal elements. The invention is applicable to semiconductor devices other than the flash memory and other types of memories—for example, a semiconductor device such as a microprocessor/controller. In this case, there is an advantage such as providing the drivability with the voltage of a single dry battery.

Optionally in FIG. 28, a memory such as SRAM or DRAM may be superposed together with the flash memory.

Furthermore, according to this invention, it is possible to lower the power supply voltage to about 1V while enabling reduction of the parts-mount area. Accordingly, when applying the semiconductor device or multi-chip type semiconductor device of the invention to mobile electronic equipment such as cellular phones and PDAs or the like, it becomes possible to achieve low power consumption while at the same time downsizing the equipment at low assembly costs.

The reference characters as used in the description indicate the following parts or components.

10 . . . First Semiconductor Device, 11, 21 . . . Memory Cell Area, 12, 22 . . . Peripheral Circuit Area, 20 . . . Second Semiconductor Device, 30 . . . CPU, 40 . . . Memory Card, 100 . . . Primary Voltage Booster Circuit, 101 . . . Input Power Supply Voltage, 102 . . . Output Voltage of Primary Booster Circuit, 103, 203 . . . Limiter, 104, 204 . . . Oscillator, 110 . . . Inductance, 120, 121 . . . Switching Element, 130, 131, 170 . . . Diode, 140, 141 . . . Switching Element Gate Driver Circuit, 142 . . . Control Circuit, 150, 151 . . . Output Smoothing Capacitor, 160 . . . Capacitor, 200 . . . Secondary Voltage Booster Circuit, 900 . . . Nth Voltage Booster Circuit, 902 . . . Output Voltage, 910 . . . Voltage Control Unit, 1000 . . . Memory Cell Array, 1110, 1120 . . . Voltage Booster Circuit Area.

INDUSTRIAL APPLICABILITY

In the present invention, it is possible to provide a semiconductor device capable of achieving miniaturization without having to reduce the efficiency of power supply while enabling reduction of switching noises. It is also possible to provide a memory card using the same.

What is claimed is:

1. A semiconductor device comprising a plurality of stages of voltage booster circuits for potentially raising a power supply voltage up to a predetermined final output voltage, an output voltage control means connected to a voltage booster circuit adjacent to a final stage of said voltage booster circuits, and an internal element to which an output of said voltage booster circuits is supplied, wherein a first stage voltage booster circuit of said voltage booster circuits for raising the power supply voltage up to a primary voltage is formed of a converter circuit including an inductance element, a switching element and a diode, wherein voltage booster circuits in back of the first stage for raising said primary voltage up to the predetermined final voltage are each configured from a charge pump circuit including a capacitance element and a diode or a converter circuit including an inductance element, a switching element and a diode, wherein the inductance element and the switching element plus the diode making up said voltage booster circuit as well as said output voltage control means and said internal element are formed on a semiconductor substrate, and wherein said output voltage control means controls the voltage booster circuit near said final stage and supplies its output to said internal element.

2. A semiconductor device comprising a plurality of stages of voltage booster circuits for potentially raising a power supply voltage up to a predetermined final output voltage, an output voltage control means connected to a voltage booster circuit near a final stage of said voltage booster circuits, and an internal element to which an output of said voltage booster circuits is supplied, wherein a first stage voltage booster circuit of said voltage booster circuits for raising the power supply voltage up to a primary voltage is formed of a charge pump circuit including a capacitance element and a diode, wherein any one of voltage boost stages in back of the first stage for raising said primary voltage up to the predetermined final voltage is configured from a converter circuit including an inductance element, a switching element and a diode, wherein the inductance element and the switching element plus the diode making up said voltage booster circuit as well as said output voltage control means and said internal element are formed on a semiconductor substrate, and wherein said output voltage control means controls the voltage booster circuit near said final stage and supplies its output to said internal element.

3. The semiconductor device according to claim 2, wherein a voltage boost ratio of said first stage voltage booster circuit is less than that of a converter circuit at a succeeding location of said first stage.

4. The semiconductor device according to claim 1, wherein said power supply voltage is less than or equal to 2.5V.

5. The semiconductor device according to claim 1, wherein at least one converter circuit of said converter circuits is such that its voltage boost ratio is maintained at a preset value during a voltage boosting operation.

6. The semiconductor device according to claim 1, further comprising means for causing, in at least one converter circuit of said converter circuits, a voltage boost ratio to be retained at a preset value during a voltage boost operation and for arbitrarily setting the voltage boost ratio.

7. The semiconductor device according to claim 1, wherein at least one converter circuit of said converter circuits is such that a switching duty ratio is kept at a preset value during a voltage boost operation.

8. The semiconductor device according to claim 1, wherein at least one converter circuit of said converter circuits is 10 MHz or more in its switching frequency.

9. The semiconductor device according to claim 1, wherein said inductance element is a parallel connection type inductance element consisting essentially of multilayered metal wiring layers and a dielectric film provided between the wiring layers, with said multilayered metal wiring layers being connected in parallel.

10. The semiconductor device according to claim 9, wherein a metal wire forming said inductance element is a spiral-shaped wiring line, wherein said spiral-shaped wiring line has an outer peripheral end connected to a wire for supplying said power supply voltage and also has an inner peripheral end connected via a metal wire to a diffusion layer of said switching element as formed in an element area beneath an inductance element.

11. The semiconductor device according to claim 1, wherein said internal element operable upon application of a voltage higher than the power supply voltage is a non-volatile memory.

12. A memory card using the semiconductor device according to claim 1.

13. A semiconductor device comprising:
a plurality of stages of voltage booster circuits for raising a power supply voltage up to a prespecified final output voltage;
a voltage control unit connected to more than one voltage booster circuit within said plurality of stages of voltage booster circuits for controlling an output voltage near a final stage; and
an internal element to which the final output voltage is supplied from said plurality of stages of voltage booster circuits, wherein
a converter circuit provided within said plurality of stages of voltage booster circuits at least has an inductance element, a switching element, a diode and a driver circuit for driving said switching element, and
said inductance element of said converter circuit at least includes a metal wire to be formed at the same time during formation of either a signal wire of said internal element or a metal wire used for power supply wiring.

14. The semiconductor device according to claim 13, wherein said inductance element is a parallel-connection type inductance element with multilayered metal wires being connected in parallel.

15. A memory card using the semiconductor device according to claim 13.

16. The semiconductor device according to claim 14, wherein said semiconductor device is any one of a flash memory and a flash memory-embedded microcomputer.

17. The semiconductor device according to claim 14, wherein said multilayered metal wires making up said inductance element are such that central points of respective areas of respective metal wires forming an inductance element upon overlapping of projection images thereof are within areas of mutually different metal wires.

18. A multi-chip type semiconductor device comprising a plurality of semiconductor devices each including a plurality of stages of voltage booster circuits for potentially raising a power supply voltage up to a final output voltage, a voltage control unit connected to more than one voltage booster circuit within said plurality of stages of voltage booster circuits for controlling an output voltage near a final stage, and an internal element to which the final output voltage is supplied from said plurality of stages of voltage booster circuits, and also including within said plurality of stages of voltage booster circuits a converter circuit at least having an inductance element, a switching element, a diode and a driver circuit for driving said switching element while letting said inductance element of said converter circuit include at least a metal wire as formed by the same process as either a signal wire of said internal element or a metal wire used for power supply wiring, wherein
said plurality of semiconductor devices are disposed to overlap respectively, and wherein the inductance elements within neighboring ones of said semiconductor devices are laid out in such a manner as to prevent inductance elements within the semiconductor devices from mutually overlapping in directions lying immediately above and below said inductance elements.

19. The multi-chip type semiconductor device according to claim 18, wherein said plurality of semiconductor devices are formed on a semiconductor chip, and wherein said inductance element of said semiconductor device is formed at one half side part of the semiconductor chip whereas the inductance element of another semiconductor device lying next to said semiconductor device is at a remaining half side part of the chip.

20. The multi-chip type semiconductor device according to claim 18, wherein said inductance element is a parallel connection type inductance element with a parallel connection of multilayered metal wiring layers.

21. The multi-chip type semiconductor device according to claim 18, wherein said semiconductor device is a flash memory or a flash memory-embedded microcomputer.

22. The multi-chip type semiconductor device according to claim 18, wherein said multilayered metal wires making up said inductance element are such that central points of respective areas of respective metal wires forming an inductance element upon overlapping of projection images thereof are within areas of mutually different metal wires.

23. A semiconductor device comprising:
a plurality of stages of voltage booster circuits for potentially raising a power supply voltage up to a final output voltage;
a voltage control unit connected to more than one voltage booster circuit within said plurality of stages of voltage booster circuits, for controlling an output voltage near a final stage; and
an internal element to which the final output voltage is supplied from said plurality of stages of voltage booster circuits, wherein
a first stage voltage booster circuit within said plurality of stages of voltage booster circuits has a converter circuit having an inductance element, a switching element, a diode, and a driver circuit for driving said switching element, and
said switching element and said diode of said converter circuit are partly disposed to underlie said inductance element.

24. A semiconductor device comprising:
a voltage step-down circuit for potentially reducing an input voltage to a final output voltage, wherein
said voltage step-down circuit has a converter circuit having an inductance element, a switching element, a diode, a driver circuit for driving said switching element, and a control circuit for control of an output voltage, and
said switching element and said diode of said converter circuit are partially laid out to underlie said inductance element.

25. The semiconductor device according to claim 23, further comprising:
a spirally wired first metal wire for forming said inductance element;
a second metal wire connected to an outer periphery end of said first metal wire for supplying said power supply voltage;
an interlayer connection wire connected to an inner periphery end of said first metal wire while being wired from said inner periphery end toward underlying diffusion layers of said switching element and said diode; and
a third metal wire for connection between the diffusion layers of said switching element and said diode.

26. The semiconductor device according to claim 24, said device has a first metal wire as spirally wired to form said inductance element, an interlayer connection wire connected to an inner periphery end of said first metal wire while being wired from said inner periphery end toward underlying diffusion layers of said switching element and said diode, a third metal wire for connection between the diffusion layers of said switching element and said diode, and a fourth metal wire connected to an outer periphery end of said first metal wire for outputting said final output voltage thus reduced in potential.

27. The semiconductor device according to claim 23, wherein said switching element and said diode are laid out on a semiconductor substrate so that a drain-side region of said switching element and an anode-side region of said diode oppose each other, thereby having a configuration including a parallel connection of at least two or more sets of combination units of switching elements and diodes with both regions electrically coupled together.

28. The semiconductor device according to claim 24, wherein said switching element and said diode are laid out on a semiconductor substrate so that a source-side region of said switching element and a cathode-side region of said diode oppose each other, thereby a configuration including a parallel connection of at least two or more sets of combination units of switching elements and diodes with both regions electrically coupled together.

29. The semiconductor device according to claim 23, wherein said inductance element is such that a plurality of layers each having said first metal wire and an inter-wiring layer dielectric film are connected in parallel.

30. The semiconductor device according to claim 23, wherein said semiconductor device is any one of a nonvolatile memory and a nonvolatile memory-embedded microcomputer.

31. The semiconductor device according to claim 30, wherein said nonvolatile memory or said nonvolatile memory-embedded microcomputer is a flash memory or a flash memory-embedded microcomputer.

32. A multi-chip type semiconductor device comprising a plurality of semiconductor devices each including a plurality of stages of voltage booster circuits for potentially raising a power supply voltage up to a final output voltage, a voltage control unit connected to more than one voltage booster circuit within said plurality of stages of voltage booster circuits for controlling an output voltage near a final stage, and an internal element to which the final output voltage is supplied from said plurality of stages of voltage booster circuits, wherein a first stage voltage booster circuit within said plurality of stages of voltage booster circuits has a converter circuit having an inductance element, a switching element, a diode and a driver circuit for driving said switching element, and wherein said switching element and said diode of said converter circuit are partly disposed to underlie said inductance element, wherein said plurality of semiconductor devices are disposed to overlap respectively, and wherein said inductance elements within neighboring ones of said semiconductor devices are laid out in such a manner as to prevent said inductance elements within other semiconductor devices from mutually overlapping in directions immediately above and beneath said inductance elements.

33. The multi-chip type semiconductor device according to claim 32, wherein said plurality of semiconductor devices are formed on a semiconductor chip, and wherein said inductance element of said semiconductor device is formed at part of on half side of the semiconductor chip whereas an inductance element of another semiconductor device neighboring upon said semiconductor device is formed at part of a remaining half side of the chip.

34. The multi-chip type semiconductor device according to claim 32, wherein each of said plurality of semiconductor devices is a nonvolatile memory or a nonvolatile memory-embedded microcomputer.

35. The multi-chip type semiconductor device according to claim 32, wherein said nonvolatile memory or said nonvolatile memory-embedded microcomputer is a flash memory or a flash memory-embedded microcomputer.

* * * * *